US010720541B2

(12) United States Patent
Gerwing et al.

(10) Patent No.: US 10,720,541 B2
(45) Date of Patent: Jul. 21, 2020

(54) FOLDABLE SOLAR TRACKING SYSTEM, ASSEMBLY AND METHOD FOR ASSEMBLY, SHIPPING AND INSTALLATION OF THE SAME

(71) Applicant: LOCKHEED MARTIN CORPORATION, Bethesda, MD (US)

(72) Inventors: David H. Gerwing, Kanata (CA); Sean C. McCarthy, Woodlawn (CA); Maureen Bradley, Marlton, NJ (US); James A. Hammell, Hainesport, NJ (US); Mitchell J.A. Loates, Ottawa (CA); Richard T. Bruno, Sewell, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 926 days.

(21) Appl. No.: 13/925,936

(22) Filed: Jun. 25, 2013

(65) Prior Publication Data
US 2013/0340807 A1  Dec. 26, 2013

Related U.S. Application Data

(60) Provisional application No. 61/664,270, filed on Jun. 26, 2012.

(51) Int. Cl.
*H02S 20/30* (2014.01)
*H02S 30/20* (2014.01)
(Continued)

(52) U.S. Cl.
CPC ............ *H01L 31/052* (2013.01); *H01L 31/02* (2013.01); *H02S 20/10* (2014.12); *H02S 20/30* (2014.12);
(Continued)

(58) Field of Classification Search
CPC .......... H02S 20/20; H02S 30/20; H02S 20/00; H02S 20/32; F24J 2/54
(Continued)

(56) References Cited

U.S. PATENT DOCUMENTS 3,295,512 A  1/1967 McCusker
4,167,936 A  9/1979 Hackworth
(Continued)

FOREIGN PATENT DOCUMENTS

FR  2461331 A1  1/1981
FR  2535033 A1  4/1984

OTHER PUBLICATIONS

Sunpower Corporation, Sunpower T20 Tracker Data Sheet, Oct. 2009.
(Continued)

*Primary Examiner* — Niki Bakhtiari
(74) *Attorney, Agent, or Firm* — Withrow & Terranova, PLLC

(57) ABSTRACT

A solar tracking assembly includes a spine and a plurality of paired brackets connected to the spine. The brackets are positioned on opposite sides of the spine and at least one of the paired brackets includes wheels to allow rolling movement of the spine. An array arm is attached to each bracket and is moveable from a shipping position to a deployed position, and at least one solar array panel is secured to each array arm. A method of installing a solar panel assembly includes assembling in a secondary automated process at least one solar panel assembly in an offsite location, loading the solar panel assembly in the shipping position on a truck, transporting the truck to a deployment site, and off-loading the solar panel assembly from said truck.

21 Claims, 28 Drawing Sheets

(51) Int. Cl.
  *H01L 31/052* (2014.01)
  *H01L 31/02* (2006.01)
  *H02S 20/32* (2014.01)
  *H02S 20/10* (2014.01)
  *F24S 25/00* (2018.01)
  *F24S 30/428* (2018.01)
  *F24S 30/425* (2018.01)

(52) U.S. Cl.
  CPC .............. *H02S 20/32* (2014.12); *H02S 30/20* (2014.12); *F24S 30/425* (2018.05); *F24S 30/428* (2018.05); *F24S 2025/012* (2018.05); *F24S 2025/014* (2018.05); *Y10T 29/49355* (2015.01)

(58) Field of Classification Search
  USPC .................................................. 136/243–265
  See application file for complete search history.

(56) References Cited

U.S. PATENT DOCUMENTS

| | | | |
|---|---|---|---|
| 4,225,781 A | 9/1980 | Hammons | |
| 4,274,712 A | 6/1981 | Sintes | |
| 4,429,178 A | 1/1984 | Prideaux et al. | |
| 4,476,853 A | 10/1984 | Arbogast | |
| 4,649,899 A | 3/1987 | Moore | |
| 4,870,949 A | 10/1989 | Butler | |
| 4,883,340 A | 11/1989 | Dominguez | |
| 4,968,355 A | 11/1990 | Johnson | |
| 5,228,924 A * | 7/1993 | Barker .................... | F24J 2/541 136/246 |
| 5,325,844 A | 7/1994 | Rogers et al. | |
| 5,349,245 A | 9/1994 | Hughes et al. | |
| 5,374,317 A | 12/1994 | Lamb et al. | |
| 5,379,596 A * | 1/1995 | Grayson ............... | F25B 27/002 136/245 |
| 5,520,747 A | 5/1996 | Marks .......................... | 136/245 |
| 5,622,078 A | 4/1997 | Mattson | |
| 5,632,823 A * | 5/1997 | Sharan ...................... | F24J 2/38 126/602 |
| 5,720,452 A * | 2/1998 | Mutschler, Jr. ......... | B64G 1/222 136/245 |
| 5,969,501 A * | 10/1999 | Glidden .................. | F24J 2/523 320/101 |
| 6,058,930 A * | 5/2000 | Shingleton ............ | F24S 30/425 126/600 |
| 6,123,067 A | 9/2000 | Warrick | |
| 6,302,099 B1 | 10/2001 | McDermott | |
| 6,563,040 B2 | 5/2003 | Hayden et al. | |
| 6,722,357 B2 | 4/2004 | Shingleton | |
| 6,958,868 B1 | 10/2005 | Pender | |
| 7,240,674 B2 | 7/2007 | Patterson | |
| 7,430,077 B2 | 9/2008 | Briee et al. | |
| D586,737 S | 2/2009 | Shugar et al. | |
| 7,531,741 B1 | 5/2009 | Melton et al. | |
| 7,557,292 B2 | 7/2009 | Shingleton et al. | |
| 7,607,427 B2 | 10/2009 | Yi et al. | |
| 7,647,924 B2 | 1/2010 | Hayden | |
| 7,677,242 B2 | 3/2010 | Carcangiu et al. | |
| 7,795,568 B2 | 9/2010 | Sherman | |
| 7,832,001 B2 | 11/2010 | Noble | |
| 7,836,879 B2 | 11/2010 | Mackamul | |
| 7,872,192 B1 | 1/2011 | Fraas et al. | |
| D640,972 S | 7/2011 | Fiero | |
| 7,971,587 B2 | 7/2011 | Gee et al. | |
| 8,119,963 B2 * | 2/2012 | Scanlon ...................... | F24J 2/38 136/244 |
| 8,459,249 B2 | 6/2013 | Corio .......................... | 126/600 |
| 8,492,645 B1 | 7/2013 | Strahm | |
| 2003/0057330 A1* | 3/2003 | Deel ........................ | B64G 1/222 244/172.8 |
| 2003/0070705 A1* | 4/2003 | Hayden .................. | F24J 2/5232 136/251 |
| 2004/0124711 A1 | 7/2004 | Muchow et al. | |
| 2005/0051209 A1* | 3/2005 | Choe ........................ | H01L 31/00 136/252 |
| 2005/0217716 A1* | 10/2005 | Masuda .................. | H02S 20/24 136/244 |
| 2006/0054162 A1 | 3/2006 | Romeo | |
| 2007/0153227 A1 | 7/2007 | Duston et al. | |
| 2007/0215199 A1 | 9/2007 | Dold et al. | |
| 2008/0128187 A1* | 6/2008 | Hu ............................. | B60L 8/00 136/244 |
| 2008/0163921 A1 | 7/2008 | Leong et al. | |
| 2008/0230047 A1 | 9/2008 | Shugar et al. | |
| 2008/0271776 A1 | 11/2008 | Morgan | |
| 2008/0308091 A1 | 12/2008 | Corio | |
| 2008/0308154 A1 | 12/2008 | Cart et al. | |
| 2009/0014054 A1 | 1/2009 | Cano Messeguer et al. | |
| 2009/0032014 A1 | 2/2009 | Meydbray ..................... | 126/608 |
| 2009/0032089 A1 | 2/2009 | Chen et al. | |
| 2009/0050191 A1 | 2/2009 | Young et al. ................ | 136/246 |
| 2009/0188546 A1 | 7/2009 | McGlynn et al. | |
| 2009/0250095 A1 | 10/2009 | Thorley et al. | |
| 2009/0260316 A1 | 10/2009 | Jones et al. | |
| 2009/0293861 A1 | 12/2009 | Taylor et al. | |
| 2009/0314325 A1* | 12/2009 | Borton ........................ | F24J 2/12 136/246 |
| 2010/0000519 A1 | 1/2010 | Zalusky et al. | |
| 2010/0000592 A1* | 1/2010 | Ko .......................... | H02S 20/00 136/246 |
| 2010/0024861 A1 | 2/2010 | Cabanillas Saldana | |
| 2010/0043866 A1 | 2/2010 | Magan De La Rocha | |
| 2010/0071684 A1 | 3/2010 | Cowan et al. | |
| 2010/0095955 A1 | 4/2010 | Carrasco Martinez | |
| 2010/0101625 A1 | 4/2010 | Kats et al. | |
| 2010/0126554 A1 | 5/2010 | Morgan et al. | |
| 2010/0139647 A1 | 6/2010 | Silvestre Mata | |
| 2010/0139731 A1 | 6/2010 | Almy | |
| 2010/0154780 A1 | 6/2010 | Linke | |
| 2010/0180884 A1 | 7/2010 | Oosting ......................... | 126/574 |
| 2010/0223865 A1 | 9/2010 | Gonzalez Moreno | |
| 2010/0258110 A1 | 10/2010 | Krabbe et al. | |
| 2010/0263710 A1 | 10/2010 | Gonzalez Moreno | |
| 2010/0275972 A1 | 11/2010 | Benitez et al. | |
| 2010/0281793 A1 | 11/2010 | McPheeters et al. | |
| 2010/0282315 A1 | 11/2010 | Gilbert | |
| 2010/0282418 A1 | 11/2010 | Lucas ............................ | 160/54 |
| 2010/0288062 A1 | 11/2010 | Meyer | |
| 2010/0294265 A1 | 11/2010 | Baer et al. | |
| 2010/0326427 A1 | 12/2010 | Chen | |
| 2011/0005573 A1 | 1/2011 | Chang et al. ................ | 136/245 |
| 2011/0005577 A1 | 1/2011 | Medina et al. | |
| 2011/0017276 A1 | 1/2011 | Boffa et al. | |
| 2011/0056484 A1 | 3/2011 | Rogers | |
| 2011/0061644 A1 | 3/2011 | Pizzarello et al. | |
| 2011/0114153 A1 | 5/2011 | Almy et al. | |
| 2011/0120447 A1 | 5/2011 | Sobolewski et al. | |
| 2011/0162691 A1 | 7/2011 | Hartelius | |
| 2011/0179791 A1 | 7/2011 | Butler et al. | |
| 2011/0186040 A1 | 8/2011 | Liao | |
| 2011/0240006 A1 | 10/2011 | Linke et al. | |
| 2011/0253193 A1 | 10/2011 | Korman et al. .............. | 136/245 |
| 2011/0289750 A1 | 12/2011 | Kats et al. | |
| 2011/0290306 A1* | 12/2011 | Roberts .................... | H02S 20/10 136/251 |
| 2012/0285506 A1 | 11/2012 | Kuo | |
| 2013/0180569 A1* | 7/2013 | Lasich ................ | H01L 31/0521 136/246 |
| 2013/0186450 A1* | 7/2013 | Smith .................... | H02J 7/0052 136/245 |
| 2013/0199594 A1 | 8/2013 | Guha et al. | |

OTHER PUBLICATIONS

Heindl Server Gmbh, Voltwerk VT News Release, Dec. 2008.
Deger Energie, Deger TOPtracker 40NT Data Sheet, Jan. 2013.
Derger Energie, Deger tracker 3000HD Data Sheet, Jan. 2013.
Non-Final Office Action for U.S. Appl. No. 14/029,860, dated Jul. 24, 2015, 20 pages.

(56) References Cited

OTHER PUBLICATIONS

Author Unknown, Definition of "Ballast," http://www.collinsdictionary.com/dictionary/english/ballast, accessed Oct. 1, 2015, HarperCollins Publishers, 1 page.
Author Unknown, Definition of "Flange," http://www.collinsdictionary.com/dictionary/english/flange, accessed Oct. 1, 2015, HarperCollins Publishers, 1 page.
Author Unknown, Definition of "Telescope," http://www.collinsdictionary.com/dictionary/english/telescope, accessed Oct. 1, 2015, HarperCollins Publishers, 1 page.
Author Unknown, Definition of "Trunnion," http://www.collinsdictionary.com/dictionary/english/trunnion, accessed Oct. 1, 2015, HarperCollins Publishers, 1 page.
Final Office Action for U.S. Appl. No. 14/029,860, dated Mar. 7, 2016, 14 pages.
Notice of Allowance for U.S. Appl. No. 14/029,860, dated May 27, 2016, 7 pages.
Office Action for Canadian Patent Application No. 2,819,338, dated Mar. 25, 2019, 3 pages.
Office Action for Canadian Patent Application No. 2,819,338, dated Feb. 13, 2020, 5 pages.

* cited by examiner

FOLDABLE SOLAR TRACKING SYSTEM, ASSEMBLY AND METHOD FOR ASSEMBLY, SHIPPING AND INSTALLATION OF THE SAME

CROSS-REFERENCE TO RELATED APPLICATIONS

This application claims priority of U.S. Provisional Application Ser. No. 61/664,270 filed Jun. 26, 2012, which is incorporated herein by reference.

TECHNICAL FIELD

Generally, the present invention is directed to a solar panel mounting configuration and a method for installing the solar panels. Specifically, the present invention is directed to the assembly and configuration of a solar panel assembly in a factory for shipping and the simplified, on-site deployment of the assembly in a solar field.

BACKGROUND ART

In view of the continuing need for renewable energy resources, solar energy is one of the primary areas of focus. Solar energy provides an abundant and readily renewable energy source without the harmful carbon emissions that are characteristic of oil, coal and natural gas. Improvements in solar panel efficiency—the panel's ability to convert more solar energy into kilowatt-hours—and in the cost of constructing the panels are making solar energy a viable alternative energy source.

It is currently known to utilize solar panel assemblies in sun-tracking systems to follow the sun's trajectory to maximize energy generation throughout the day. It is also known that tracking the sun with a solar panel assembly on one axis improves the energy capture of the solar panels by up to 25%. Most current tracking systems utilize a small number of solar panels (5-10). As such, the small number of panels on the moving parts of the solar tracker multiplies the number and complexity of the drives' mounting and control systems of a large installation, which adds overall cost for those systems and the installation thereof. Indeed, current systems require installation of a significant number of parts in the field which adds to the cost of the overall system and the installation costs. It is estimated that the cost for installing the solar panel assemblies in the field can be three times the cost of actually constructing and assembling the solar panels compared to the controlled environment of the proposed assembly plant. Installation of the solar panel assemblies in the field is also prone to weather risks and project delays. Still yet another drawback of current solar panel tracking assemblies is that their assembly in the field is not easily automated nor is there an ability to control the quality of overall construction.

Based upon the foregoing, it is readily apparent that there is a need in the art for solar panels that are mountable to a single foldable frame and wherein multiples of these frames can be shipped pre-assembled on a flatbed trailer for ease of installation. Moreover, there is a need for a solar panel assembly package that facilitates shipping of the solar panels and which also functions to serve as the structural components and shipping frames for the installed solar panel arrays.

SUMMARY OF THE INVENTION

In light of the foregoing, it is a first aspect of the present invention to provide a foldable solar tracking system and method for assembly, shipping and installation.

It is another aspect of the present invention to provide a solar tracking assembly comprising a spine, a plurality of paired brackets connected to the spine, wherein the brackets are positioned on opposite sides of the spine, and wherein at least one of the paired brackets includes wheels to allow rolling movement of the spine, an array arm attached to each bracket, the array arms moveable from a shipping position to a deployed position, and at least one solar array panel secured to each array arm.

Yet another aspect of the present invention is a method of installing a solar tracking assembly, comprising assembling in a secondary automated process location at least one solar panel assembly, which comprises a spine, a plurality of paired brackets connected to the spine, wherein the brackets are positioned on opposite sides of the spine, and wherein at least one of the paired brackets includes wheels to allow rolling movement of the spine, an array arm attached to each bracket, the array arms moveable from a shipping position to a deployed position, and at least one solar array panel secured to each array arm, moving the array arms to a shipping position, loading the solar panel assembly in the shipping position on a truck, transporting the truck to a deployment site, off-loading the solar panel assembly from the truck, unfolding the pre-assembled and pre-wired solar panels and hoisting the unfolded assembly onto the pre-assembled frames and in-field mounted ballast blocks.

Still another aspect of the present invention is to provide a method of folding a solar panel assembly for compact shipping, comprising providing a spine with a plurality of paired brackets, wherein each bracket of the paired brackets are positioned on opposite sides of the spine, each bracket having an array arm detachably mounted thereto that carries at least one solar array panel, and moving the array arms so that each solar panel faces and is substantially parallel with another solar array panel carried by the array arm attached to the other paired bracket for shipping.

Still another aspect of the present invention is to provide a solar tracking assembly, comprising a spine, a plurality of solar array panels extending from both sides of the spine, a motor having a slip clutch, the motor connected to the spine for rotation of the spine, and at least one winglet secured to selected solar array panels, wherein detection of a predetermined differential torque on the plurality of solar array panels causes the slip clutch to allow rotation of the spine to alleviate forces applied to the solar array panels by the differential torque.

BRIEF DESCRIPTION OF THE DRAWINGS

These and other features and advantages of the present invention will become better understood with regard to the following description, appended claims, and accompanying drawings wherein:

BEST MODE FOR CARRYING OUT THE INVENTION

Figure 1:
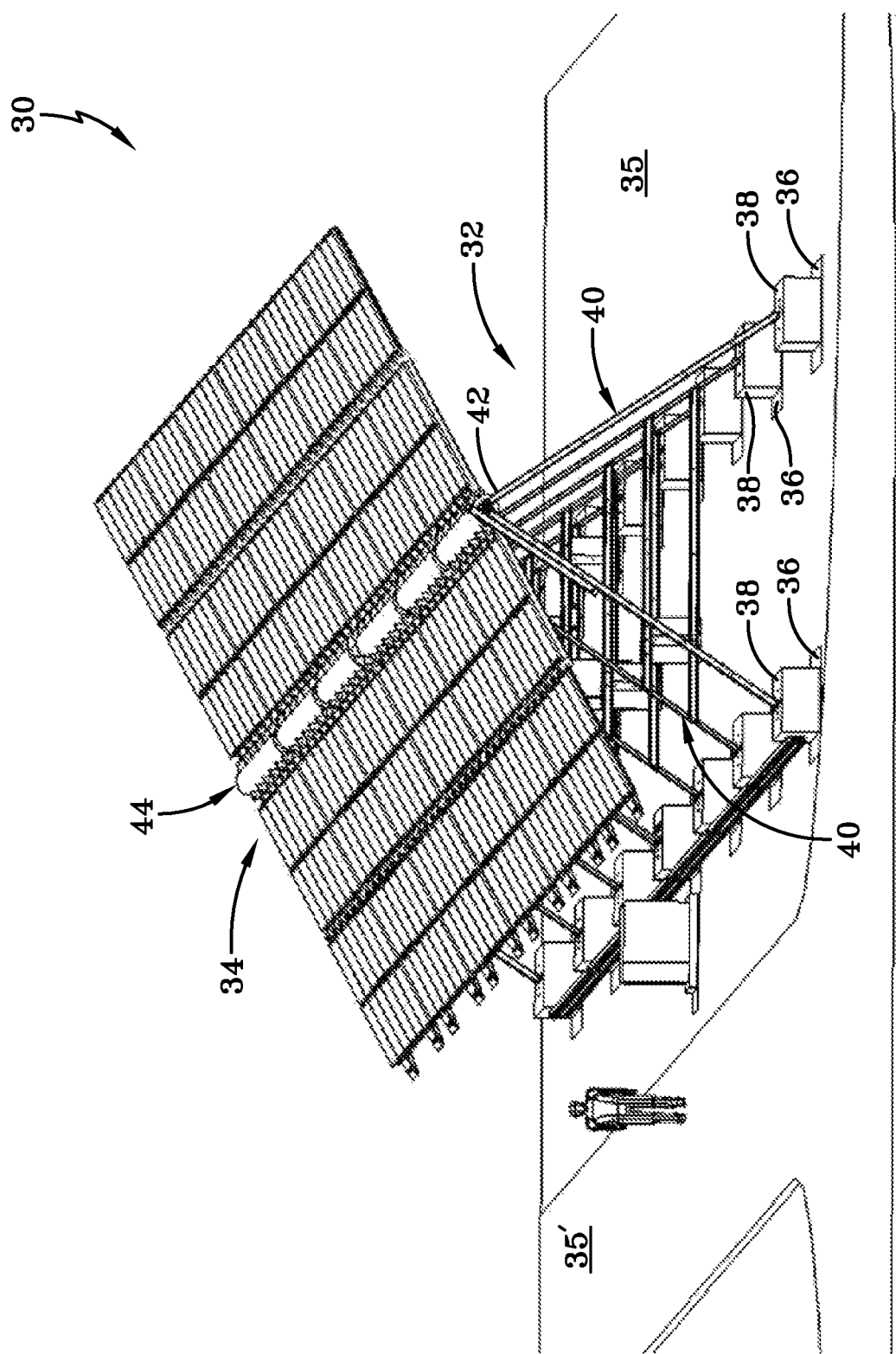
FIG. 1 is a perspective view of a solar panel assembly according to the concepts of the present invention.

Referring now to the drawings and in particular to FIG. 1, it can be seen that an installed solar panel assembly is designated generally by the numeral 30. The installed solar panel assembly 30 is shown completely assembled in FIG. 1. FIGS. 2-8 show various components that are assembled in a factory in such a way to facilitate shipping and assembly of the solar panel assembly to a location away from the factory. And FIGS. 9-17 show assembly of the solar panel assembly 30 at a desired location. The manner in which the assembly 30 is configured, assembled and shipped greatly facilitates the manner in which the assembly is installed.

The assembly 30 includes an A-frame support assembly designated generally by numeral 32 which supports at least one solar tracking array designated generally by the numeral 34. The support assembly 32 is disposed on terrain 35 which may be graded to a level condition or may have variations in grading as appropriate for the environment in which the assembly 30 is installed. An access road 35' may be provided in close proximity to the place of installation which includes a plurality of ballast pads 36, which are typically raised gravel, upon which are disposed a like number of ballast blocks 38. Skilled artisans will appreciate that the pads 36 and blocks 38 are constructed of a material that is compatible with the terrain in which they are located and at least the blocks are suitably reinforced so as to support the support assemblies 32 and the array 34.

The support assembly 32 includes a plurality of A-frame sections 40 each of which have two lower ends that are secured to respectively paired ballast blocks 38. The section 40 may be assembled from appropriately sized metal rails or the like that are connected to one another by appropriate bolts and other types of fasteners. Each A-frame section 40 provides an apex receptacle 42 that is opposite the section components that are secured to the ballast blocks 38. The solar tracking array 34 includes a spine 44 that is received on and supported by the apex receptacle 42 of the A-frame sections 40.

Figure 2:
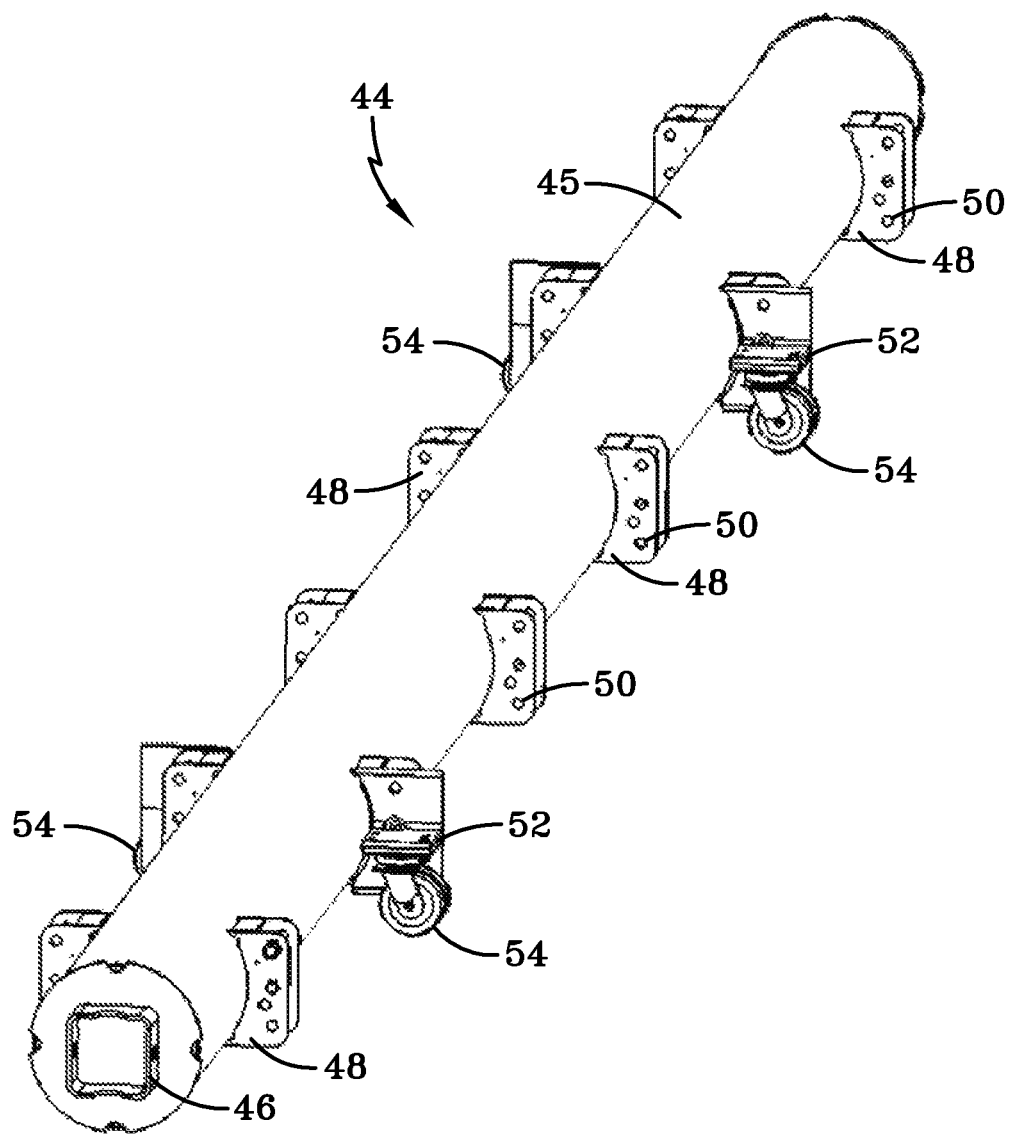
FIG. 2 is a perspective view of a spine of the solar panel assembly according to the concepts of the present invention.

As best seen in FIG. 2, the spine 44 is a cylindrical member 45, which may have a circular, rectangular or square hollow tube 46 internally maintained within the member and which axially extends therefrom. Moreover, the member 45 may be a singular piece or constructed of smaller pieces connected end-to-end. A plurality of array brackets 48 are attached, typically by welding, on opposing sides of the member 45 and spaced apart from one another on each side of the member. Each bracket 48 has a plurality of mounting holes 50 for later attachment to components of the tracking array 34. Connected to a selected number of array brackets 48 is a caster bracket 52. In some embodiments, the caster brackets 52 may be connected to each side of the cylindrical member 45 opposite one another. In the present embodiment, four caster brackets are shown attached to array brackets, but skilled artisans will appreciate that any number of caster brackets may be attached. Each caster bracket 52 includes a wheel 54, which swivels as appropriate so as to facilitate movement of the spine 44 and attached components as needed.

Figure 3:
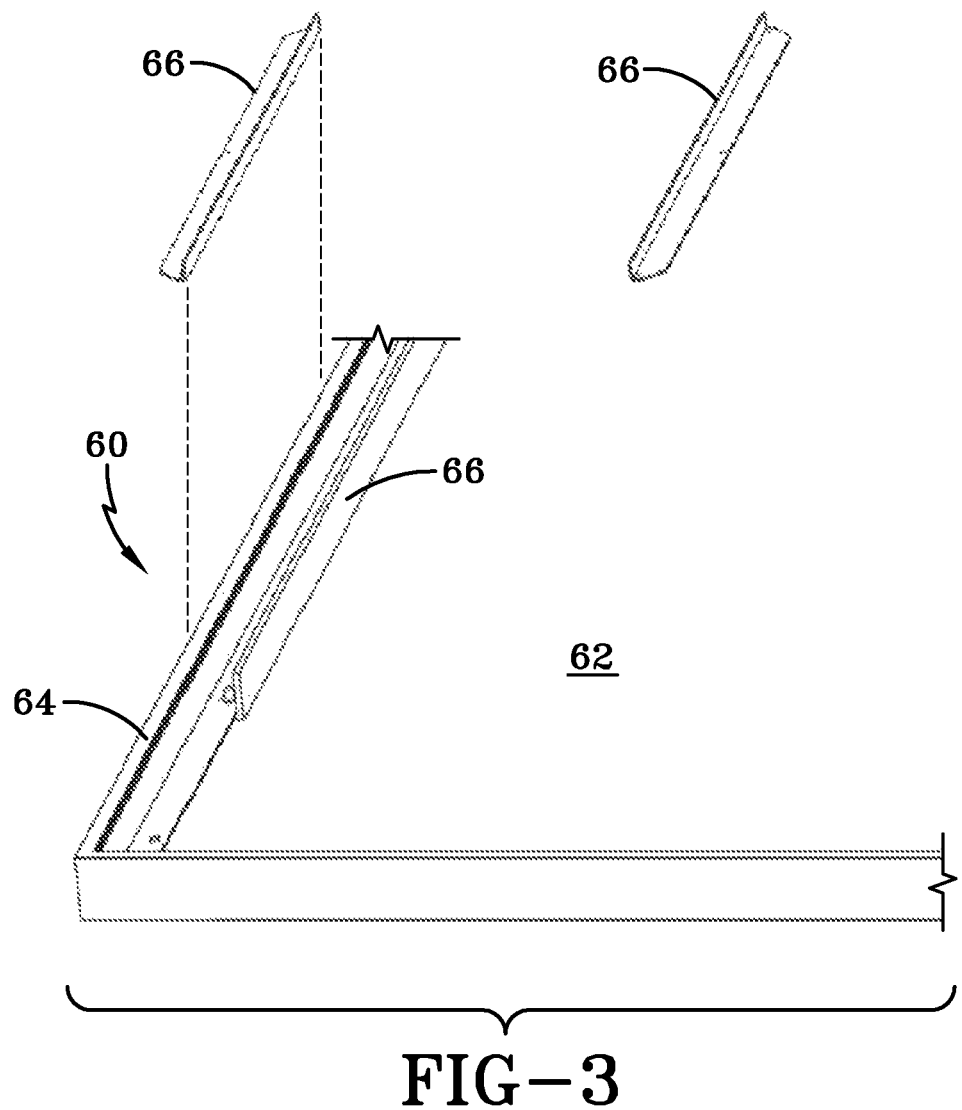
FIG. 3 is a partial perspective assembly view of a solar panel with array brackets for attachment to the array arm according to the concepts of the present invention.

Referring now to FIG. 3, it can be seen that a solar array panel 60 has a backside 62 and a side edge 64. Attached by fasteners or the like to each opposed side edge 64 is a panel mount 66, which extends substantially along the length of the side edge 64. Skilled artisans will recognize that the panel mount 66 may be eliminated by simply making the edges 64 stronger. In the alternative, the panel mount 66 may be made integral with the edge 64.

Figure 4:
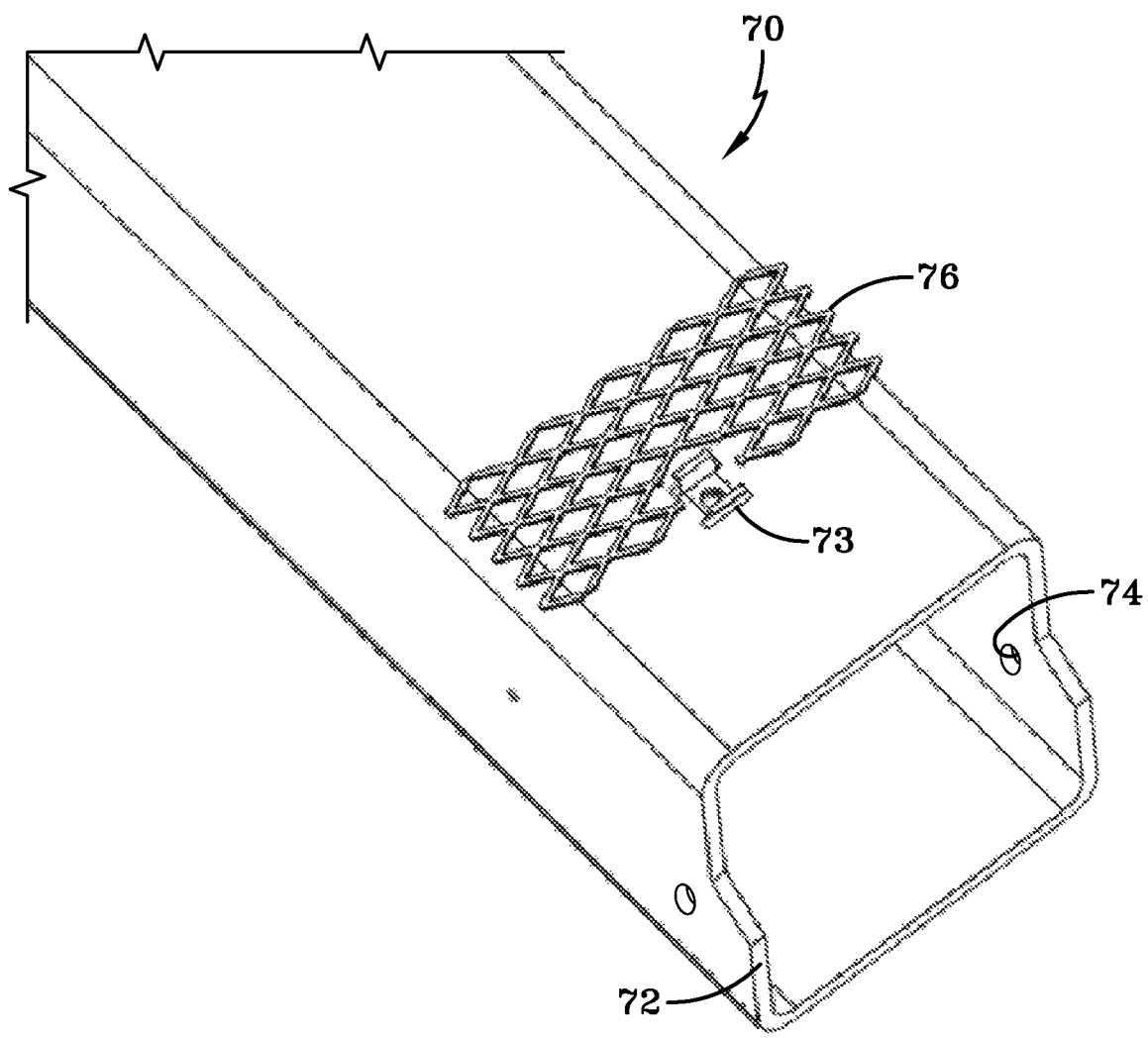
FIG. 4 is a partial perspective view of an array arm according to the concepts of the present invention.

Referring now to FIG. 4, it can be seen that an array arm 70 has an end 72 with mounting holes 74 provided therethrough. The array arm 70 may be constructed of a tubular steel material or any like material sufficient to support the weight of the solar array panels 60 that are attached. The array arm also includes a mounting hole 73 that receives a bolt or fastener for attachment to the panel mounts 62. Attached to one surface of the end 72 is an electrical grounding fixture 76, which also assists in providing galvanic isolation of any dissimilar metals which may exist between the solar panel 60 and the array arm 70. The solar array panel 60 is attached to only one panel mount 66 via two bolts reducing the number of attachment pieces for a typical solar panel to two frame rails, by a factor of two.

Figure 5:
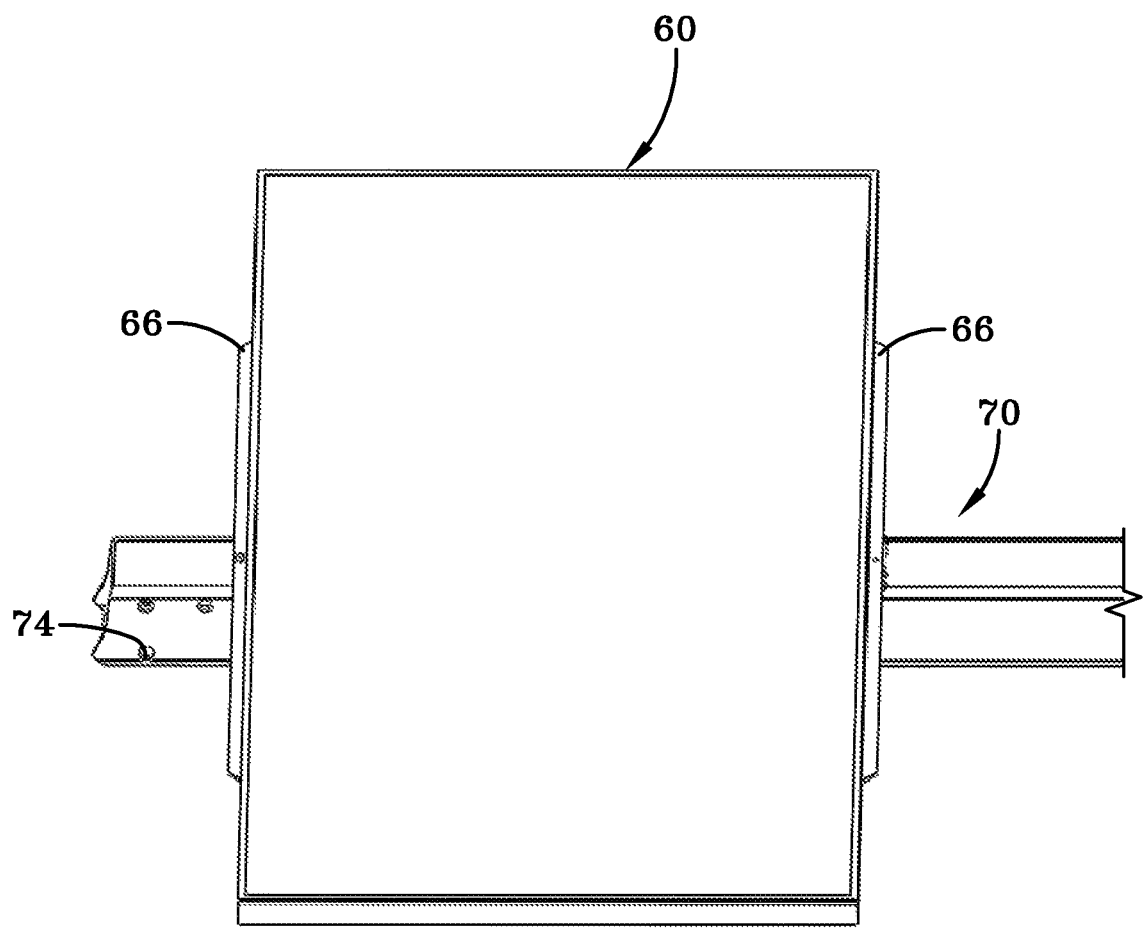
FIG. 5 is a perspective view of a solar panel attached to the array arm according to the concepts of the present invention.

As best seen in FIG. 5, a single solar array panel 60 is secured to an array arm 70 as shown. As seen, an edge of the panel mount 66 extends beyond an edge of the solar array arm 70. Additional solar array panels may be secured to the array arm.

Figure 6:
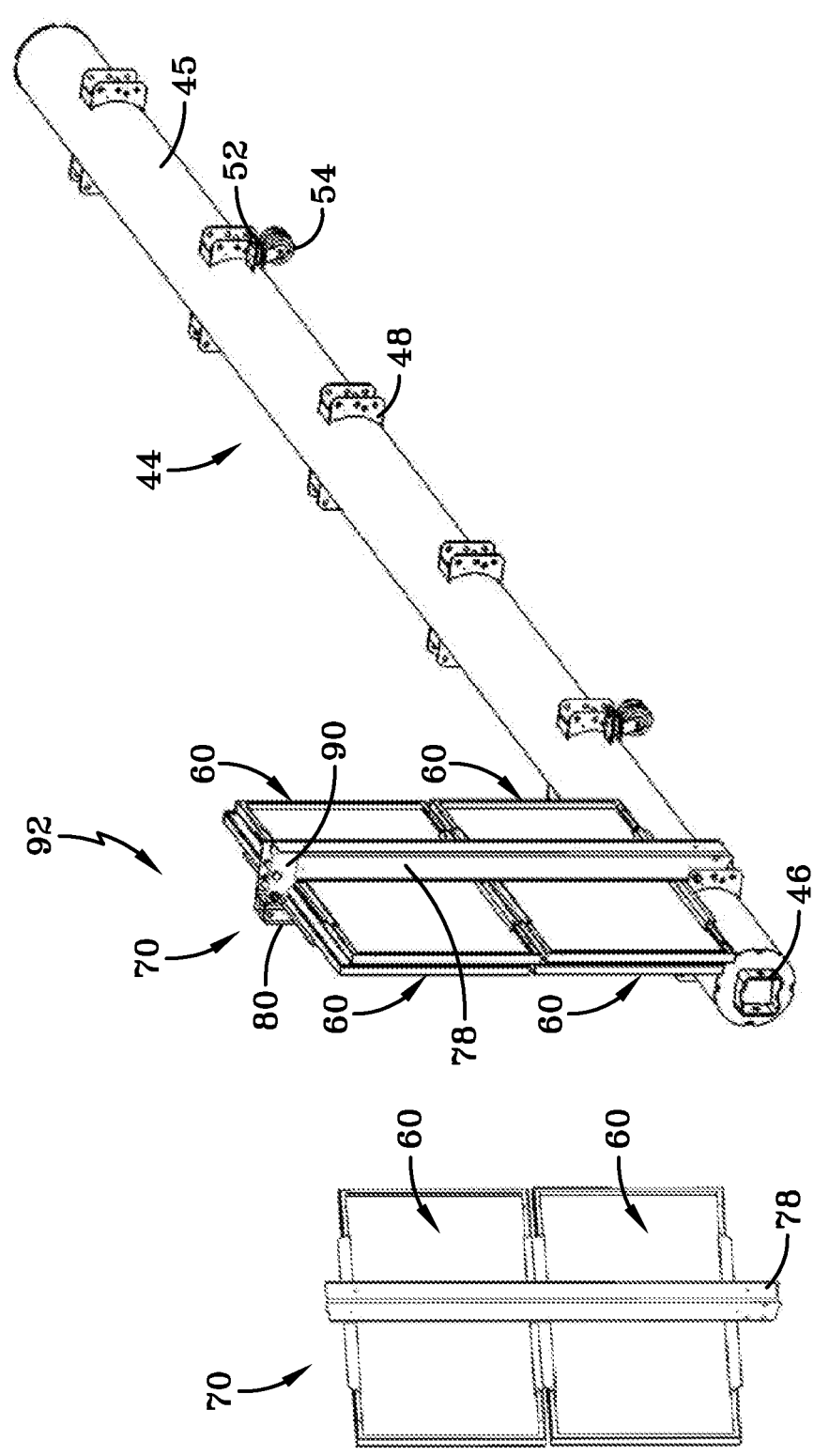
FIG. 6 is a perspective view of a solar panel sub-assembly and the solar panel sub-assembly attached to the spine according to the concepts of the present invention.

Referring now to FIG. 6, it can be seen that each array arm includes an inner array arm 78 and an outer array arm 80 that are hingedly connected to one another by a hinge 90. One end of the inner array arm 78 is attached to the cylindrical member 45 via fasteners to a corresponding array bracket 48, while an opposite end of the inner array arm 78 is attached to the hinge 90. The other side of the hinge 90 is attached to an end of the corresponding outer array arm 80. As shown, a pair of solar array panels 60 are attached to the inner array arm 78 and another pair of solar array panels 60 are attached to the outer array arm 80. Taken together, the array arms 78 and 80, the connecting hinge 90 and the attached solar array panels 60 form a solar panel sub-assembly 92. As such, FIG. 6 shows a single foldable solar panel sub-assembly 92 mounted to one side of the spine 44. The hinge 90 allows the solar panels to be folded over and face one another in a minimum volume-shipping configuration. In other words, in a shipping configuration, the inner array arm 78 is attached to the array bracket 48 so that the arm is positioned substantially tangentially to the cylindrical member 45. The hinge is in a folded position so that the panels 60 on the outer array arm 80 face the panels on the inner array arm 78.

Figure 7:
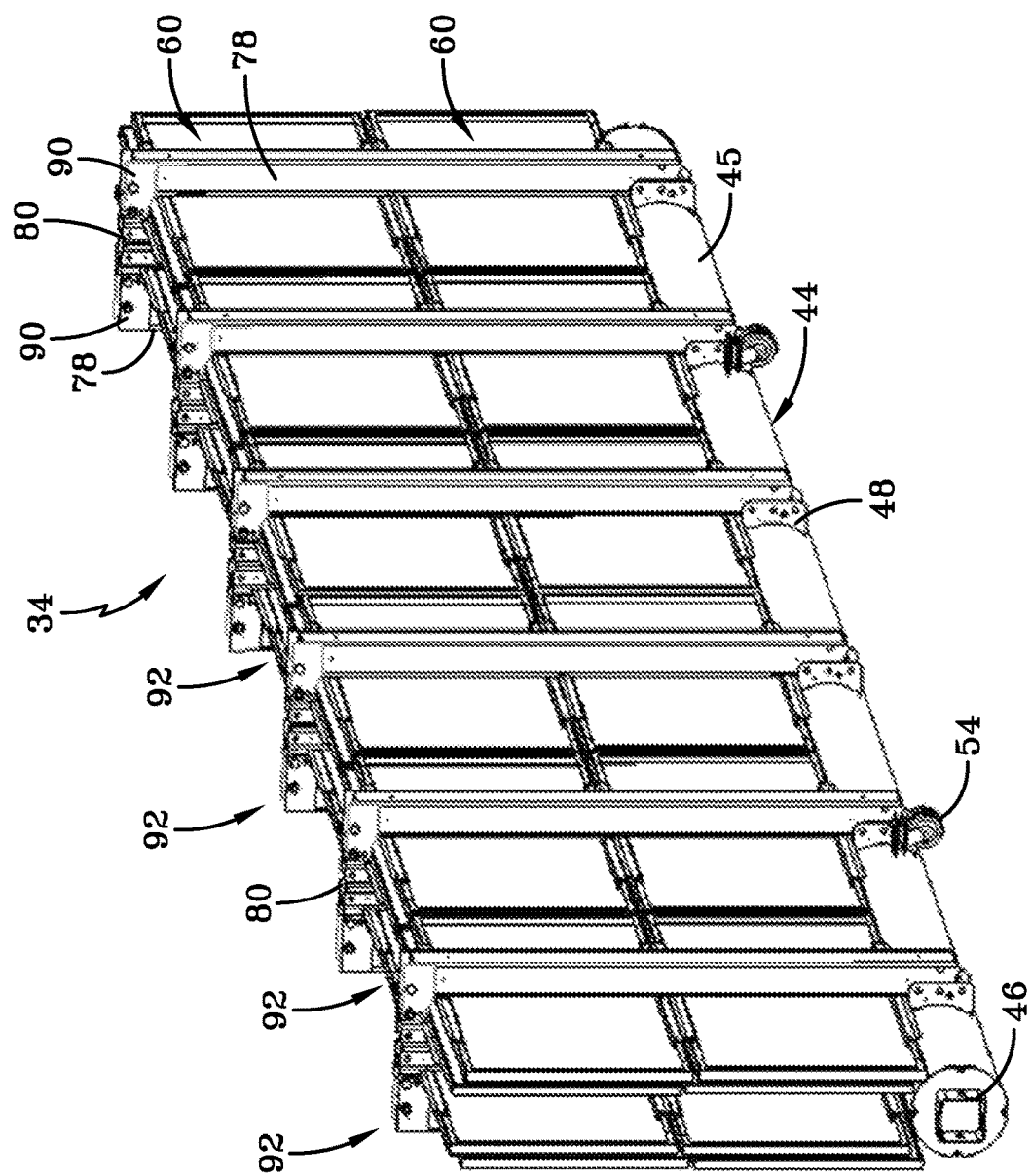
FIG. 7 is a perspective view of a solar tracking array shown in a collapsed condition for shipping according to the concepts of the present invention.

As best seen in FIG. 7, a plurality of solar panel sub-assemblies 92 are attached to each side of the spine and in particular to each appropriate array bracket 48. As such, the solar panel sub-assemblies 92, which form the tracking solar panel array 34, are shown in a collapsed minimum volume shipping configuration. As shown in FIG. 7, six sub-assemblies are secured to two opposed sides of the spine 44 to form a folded tracking solar panel array 34. Of course, any number of sub-assemblies 92 could be attached to an appropriately sized spine.

Figure 8:
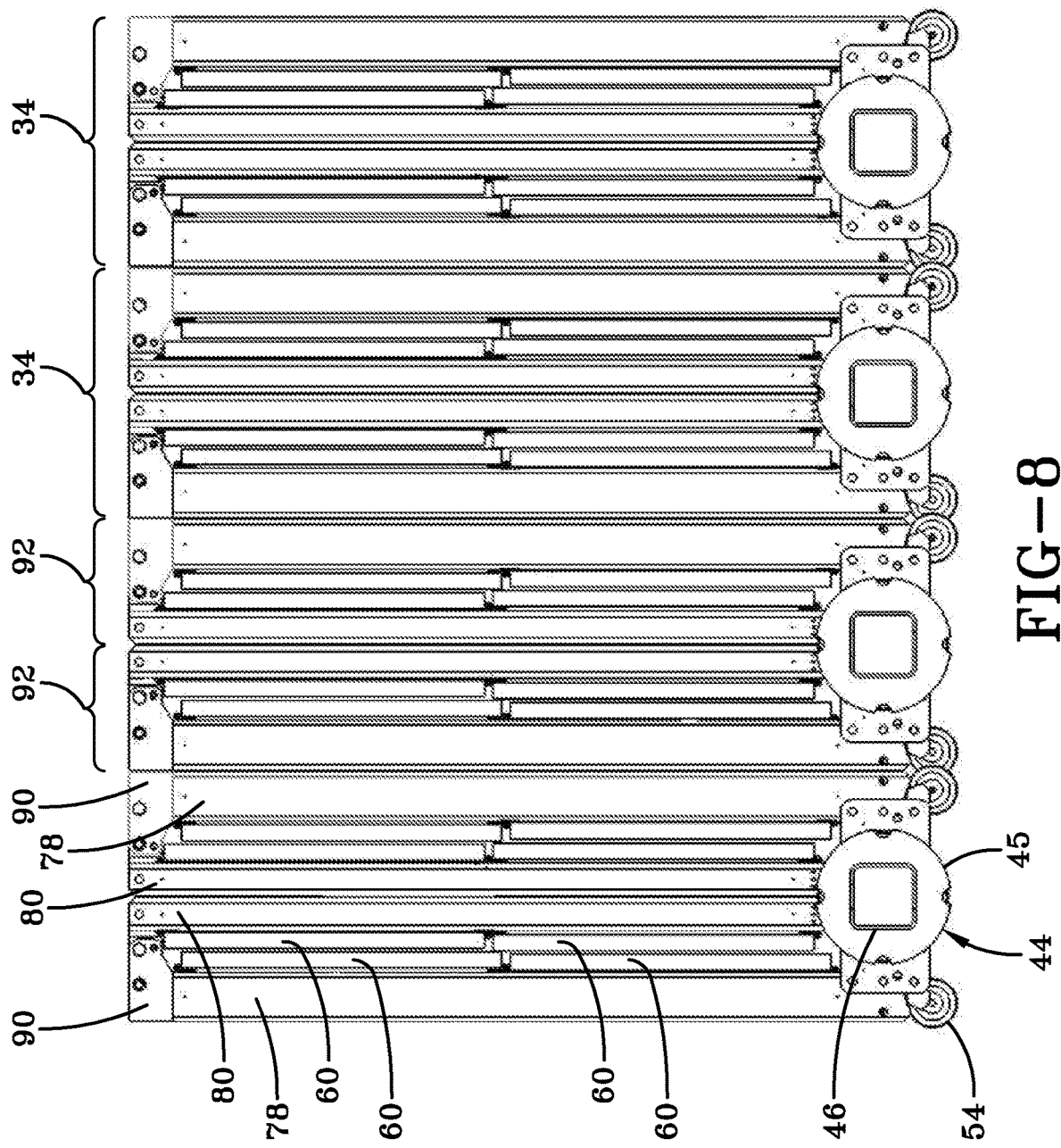
FIG. 8 is an end view of a plurality of solar tracking arrays configured for use in a solar panel system in their shipping condition according to the concepts of the present invention.
Figure 9:
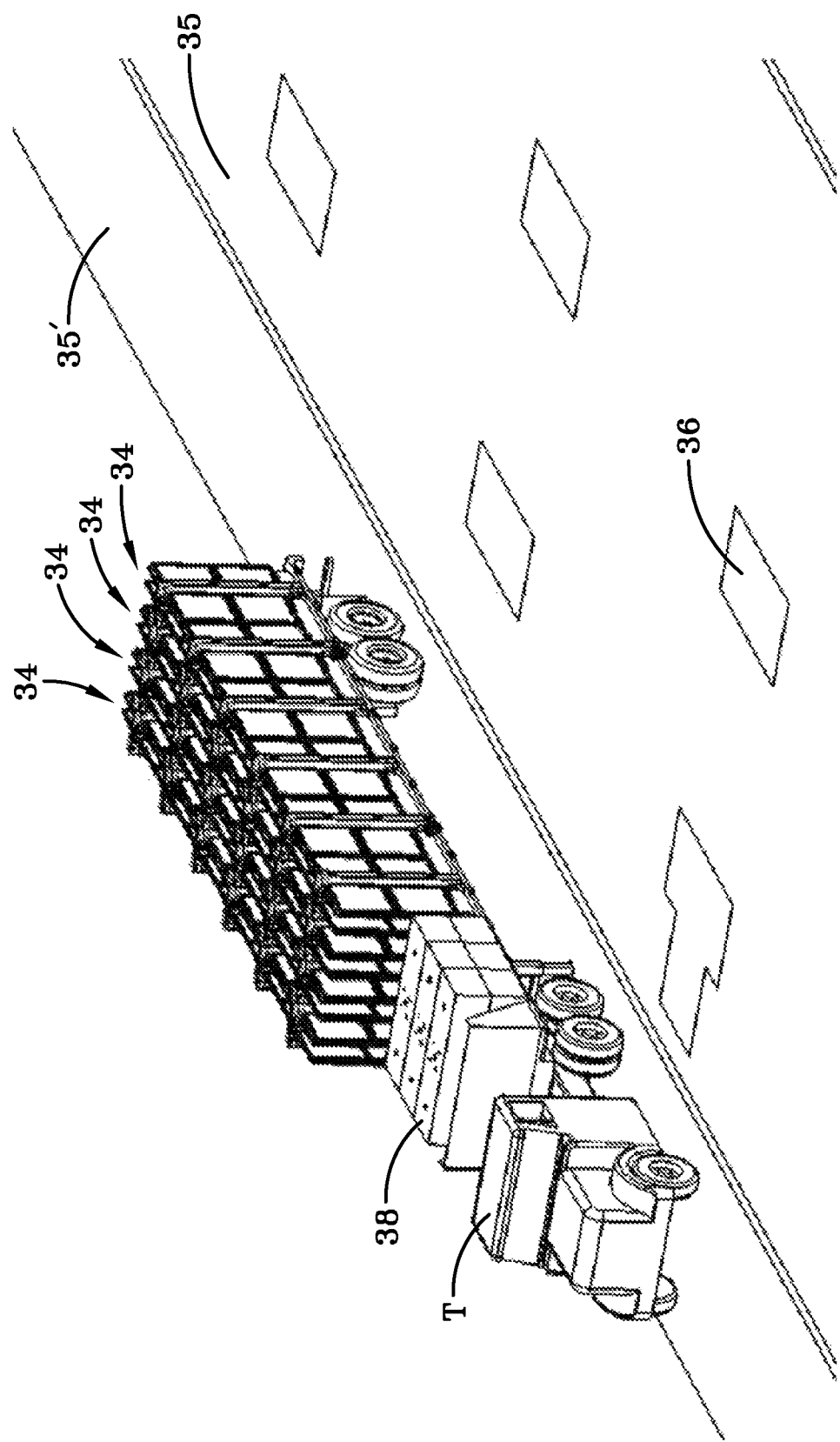
FIG. 9 is a perspective view showing transport of the solar tracking arrays according to the concepts of the present inventions.

Referring now to FIG. 8, it can be seen that a plurality of tracking solar panel arrays 34 may be positioned adjacent to one another so as to facilitate volume efficient shipping of a plurality of arrays on a flatbed trailer. It will further be appreciated that the array arms attached to the panels function to protect the solar panels from movement and unnecessary handling in the field. Indeed, the solar array panels 60 are captured in between the outer array arm 80 and the inner array arm 70. Additionally, the outer array arms 80 that are disposed on opposite sides of the cylindrical member 45 are positioned back-to-back so as to minimize jostling or other unwanted movement of the solar array panels 60 while in the shipping configuration. And while in the shipping configuration, the tracking solar panel array 34 may be positioned adjacent other arrays 34 to facilitate their collective shipping. As a result, the panels are preconfigured to the array arms in an appropriate position that is efficiently and easily deployed in the field. By configuring the panel arrays in the factory instead of in the field, the installation costs for the solar panels in the field is significantly reduced.

Figure 10:
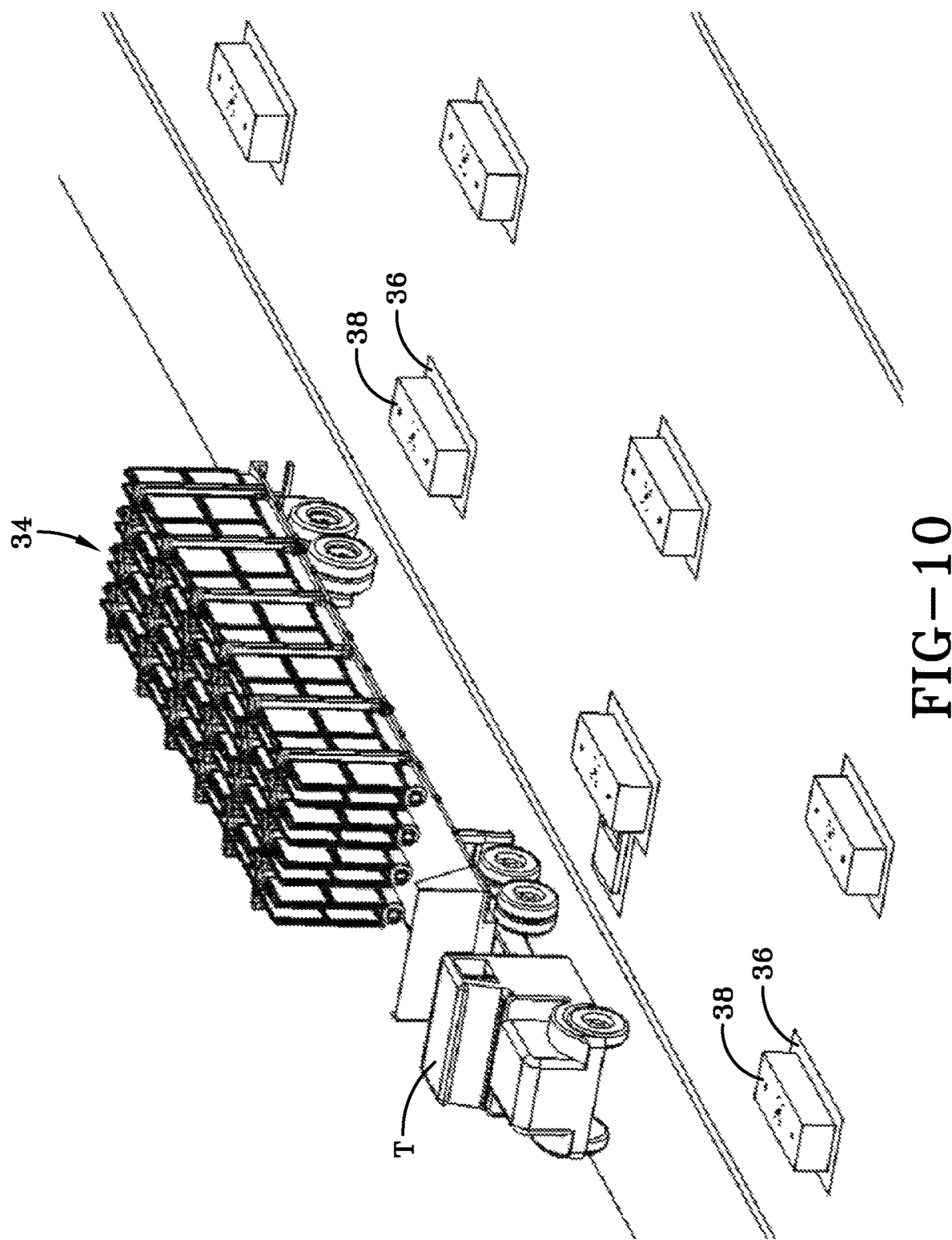
FIG. 10 is a perspective drawing showing ballast blocks off-loaded from a truck and positioned onto pre-installed ballast pads.

Referring now to FIGS. 9-17, the process for installing of the solar tracking arrays 34 can be seen. In particular, the terrain 35 is already graded and configured so as to include the ballast pads 36 in their appropriate position. A truck designated generally by the T is loaded with the solar tracking arrays 34 in their shipping condition along with the appropriate number of ballast blocks 38. The truck arrives near the ballast pads and technicians using a crane or forklift remove the ballast blocks 38 and install on them onto the ballast pads 36 as seen in FIG. 10.

Figure 11:
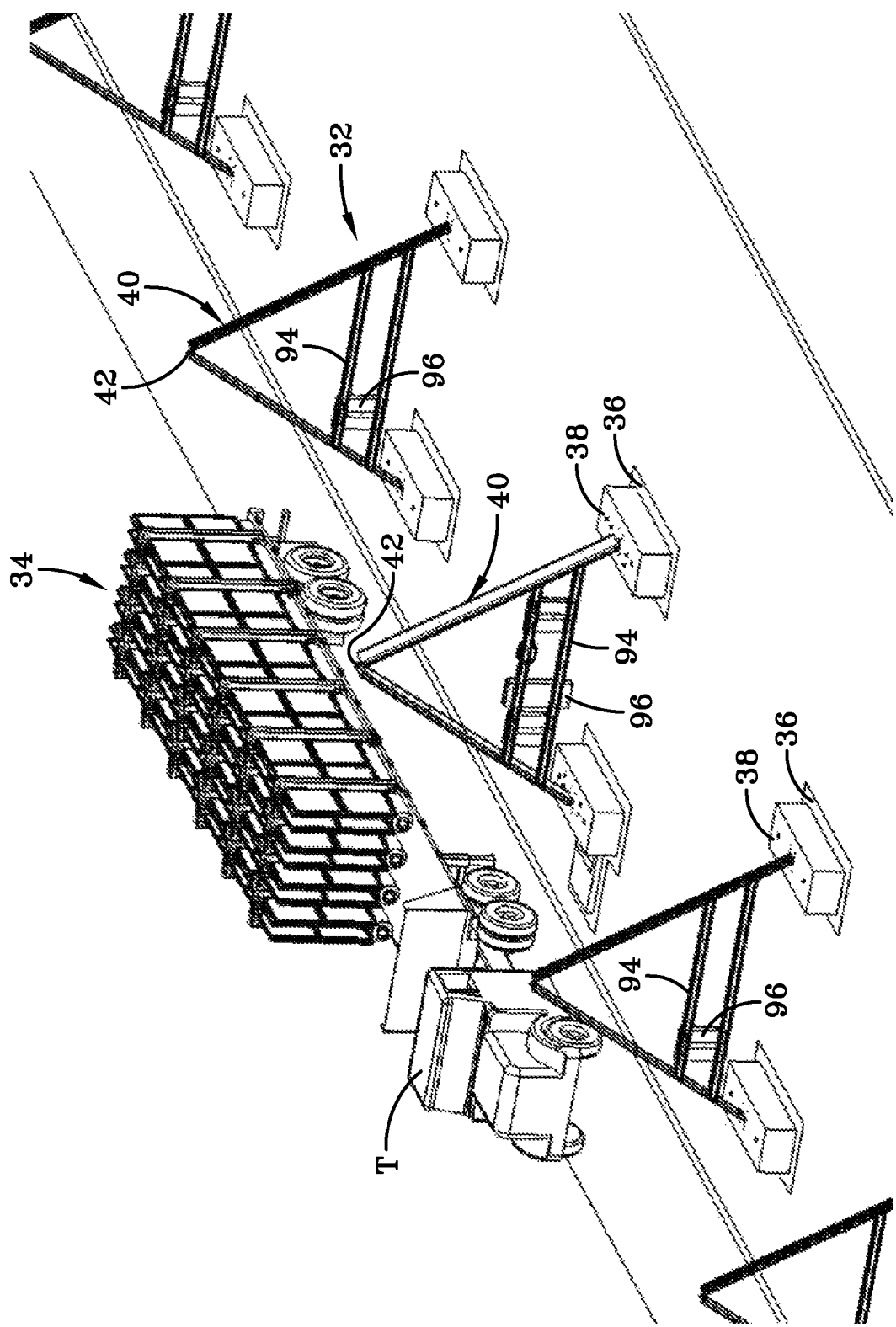
FIG. 11 is a perspective drawing showing A-frame support assemblies assembled onto corresponding ballast blocks.

As seen in FIG. 11, after the pads are installed, the A-frame support assembly 32, which may be shipped separately, is assembled. As can be seen each A-frame section 40 has its corresponding lower ends secured to the appropriate spaced apart ballast blocks 38. Each A-frame has a number of cross braces 94 which provide structural support to the A-frame and which also allow for the installation of the various control panels 96 needed to operate the installed solar panel assembly 30.

Figure 12:
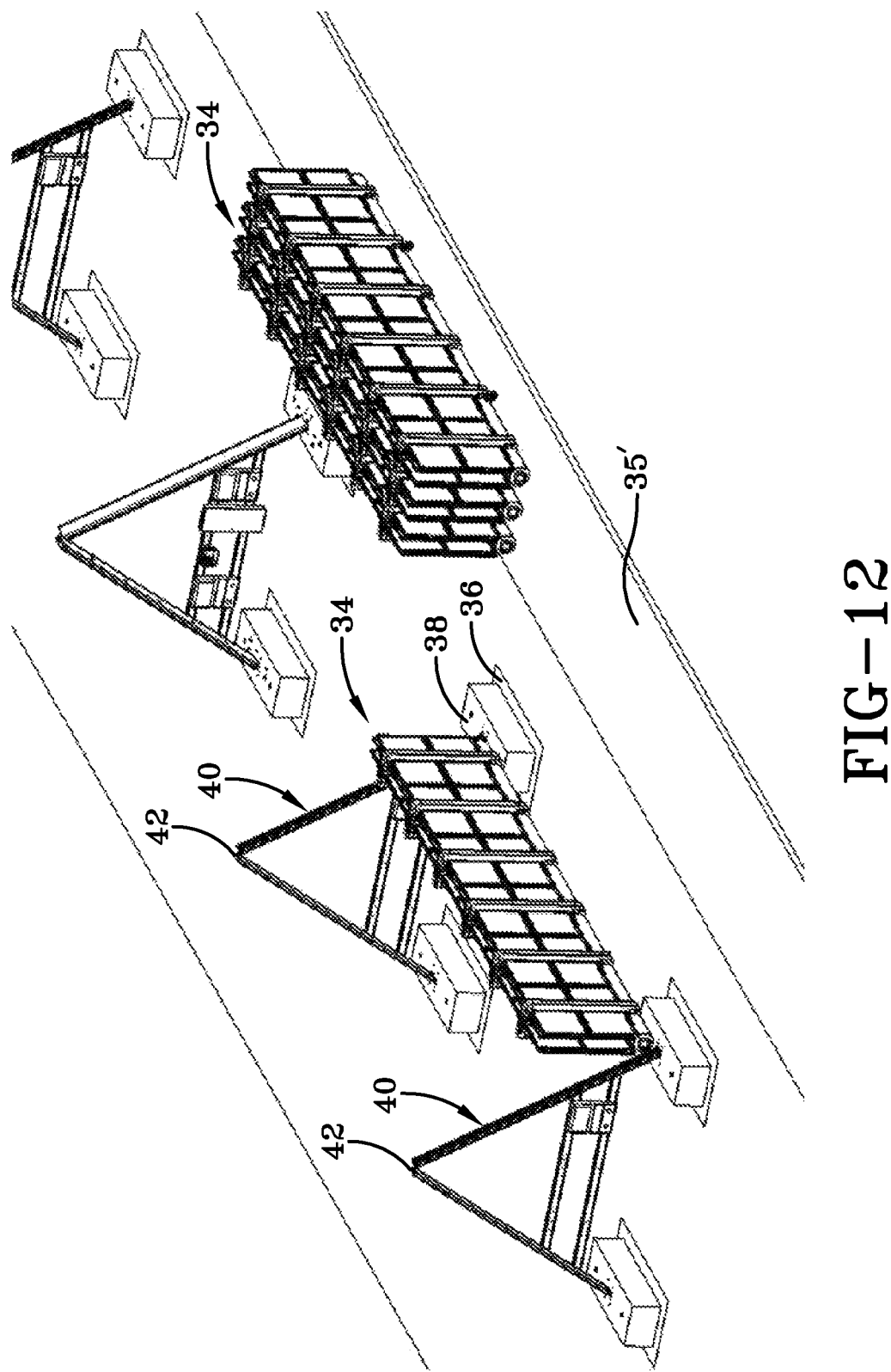
FIG. 12 is a perspective drawing showing a solar tracking array off-loaded from the truck and one of the solar tracking arrays positioned on a pair of ballast blocks.
Figure 13:
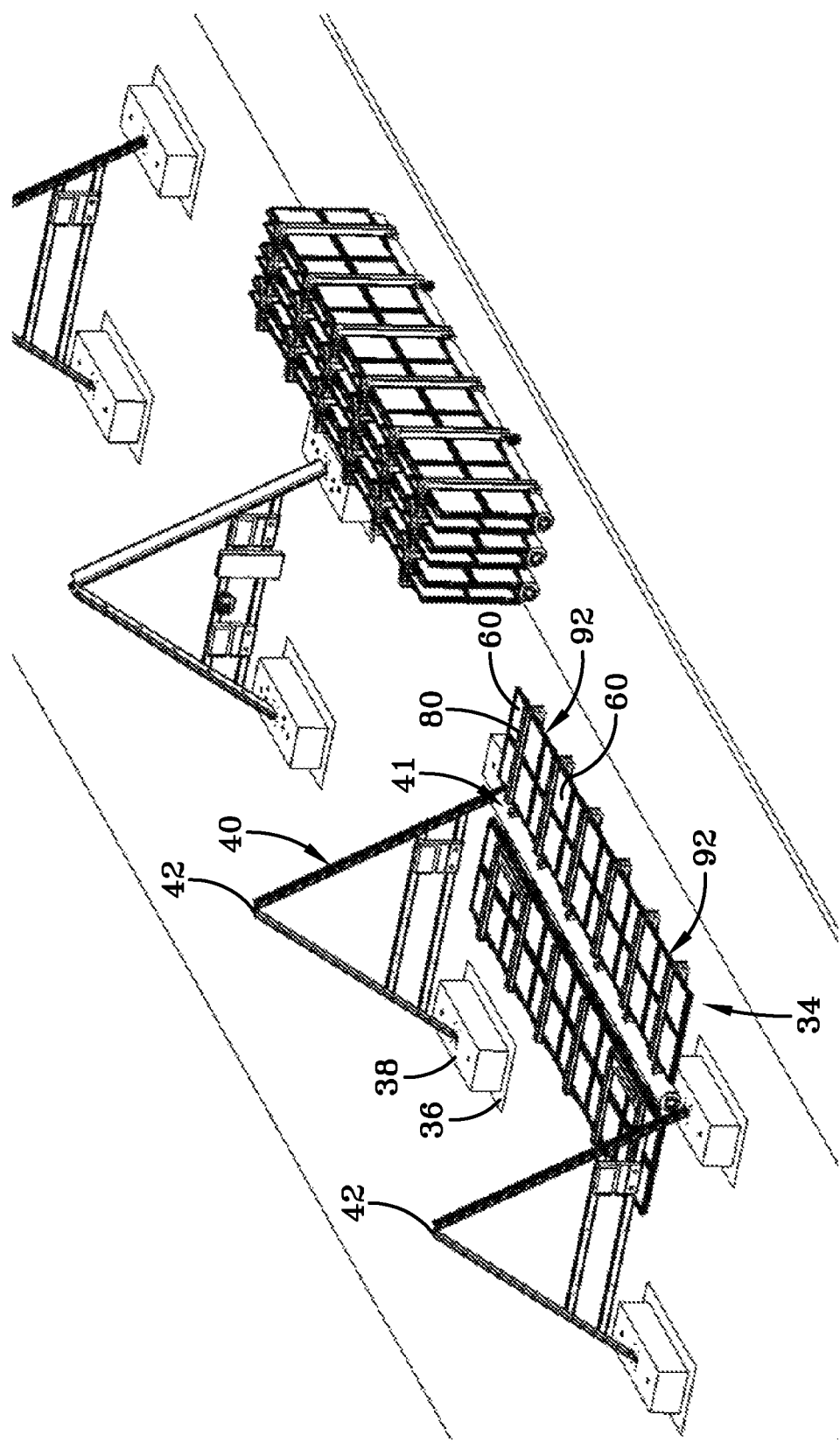
FIG. 13 is a perspective drawing showing the solar tracking array partially unfolded.

Referring now to FIG. 12, it can be seen that the plurality of solar tracking arrays 34 may be off loaded from the truck and placed on the access road 35. Each array 34 is then positioned so that each end of the spine 44 rests upon a corresponding ballast block 38. At this time, both the inner array arms 78 are unfolded so that they are disposed 180 degrees apart from one another, as best seen in FIG. 13. In other words, the connection between the array bracket 48 and the associated end of the inner array arm is undone or loosened so that the inner array arm extends substantially radially, instead of substantially tangentially, from the cylindrical member 45. At this time, the array bracket 48 and the associated end of the array arm are re-fastened or secured to one another to maintain the radial disposition.

Figure 14:
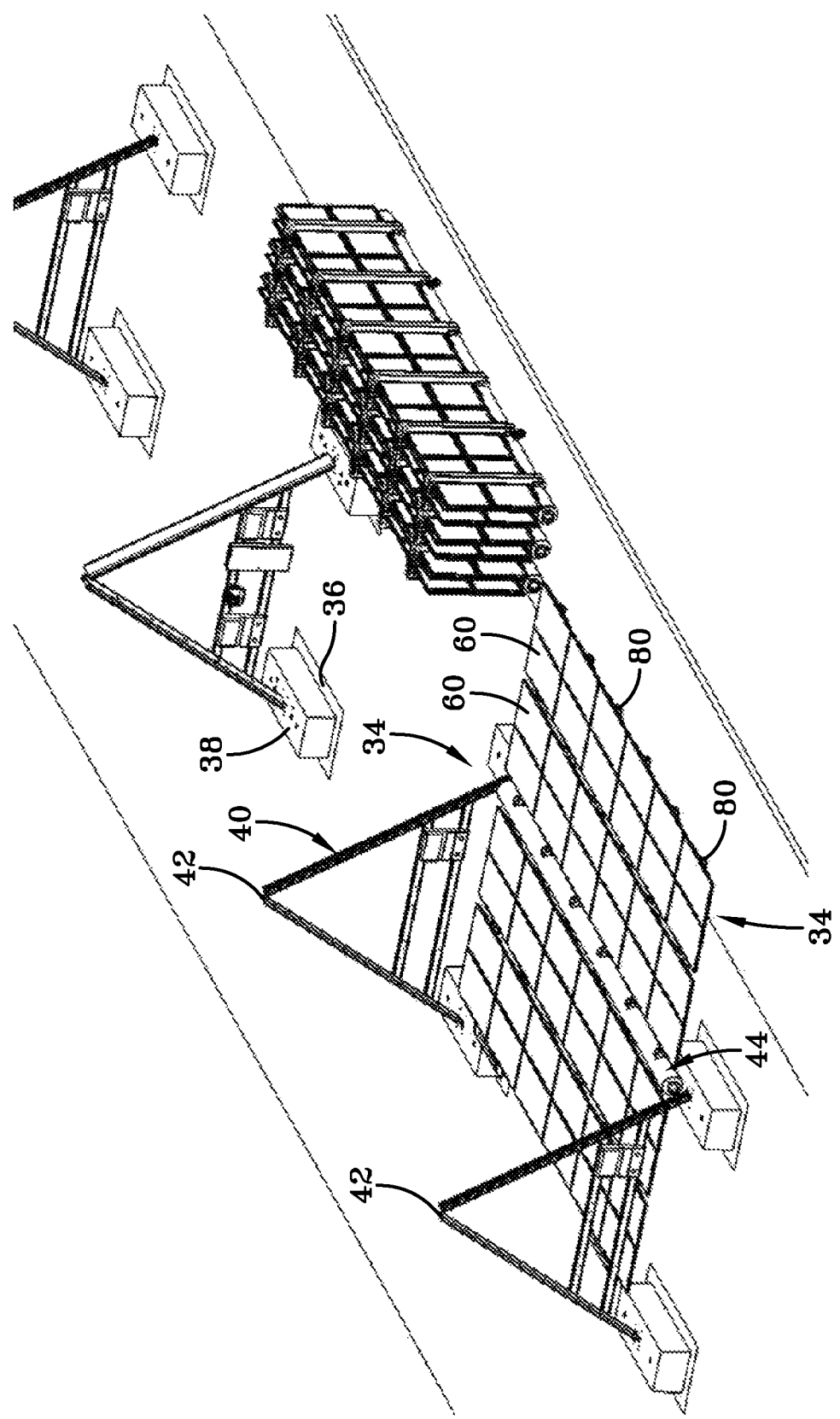
FIG. 14 is a perspective drawing showing the solar tracking array fully unfolded.
Figure 15:
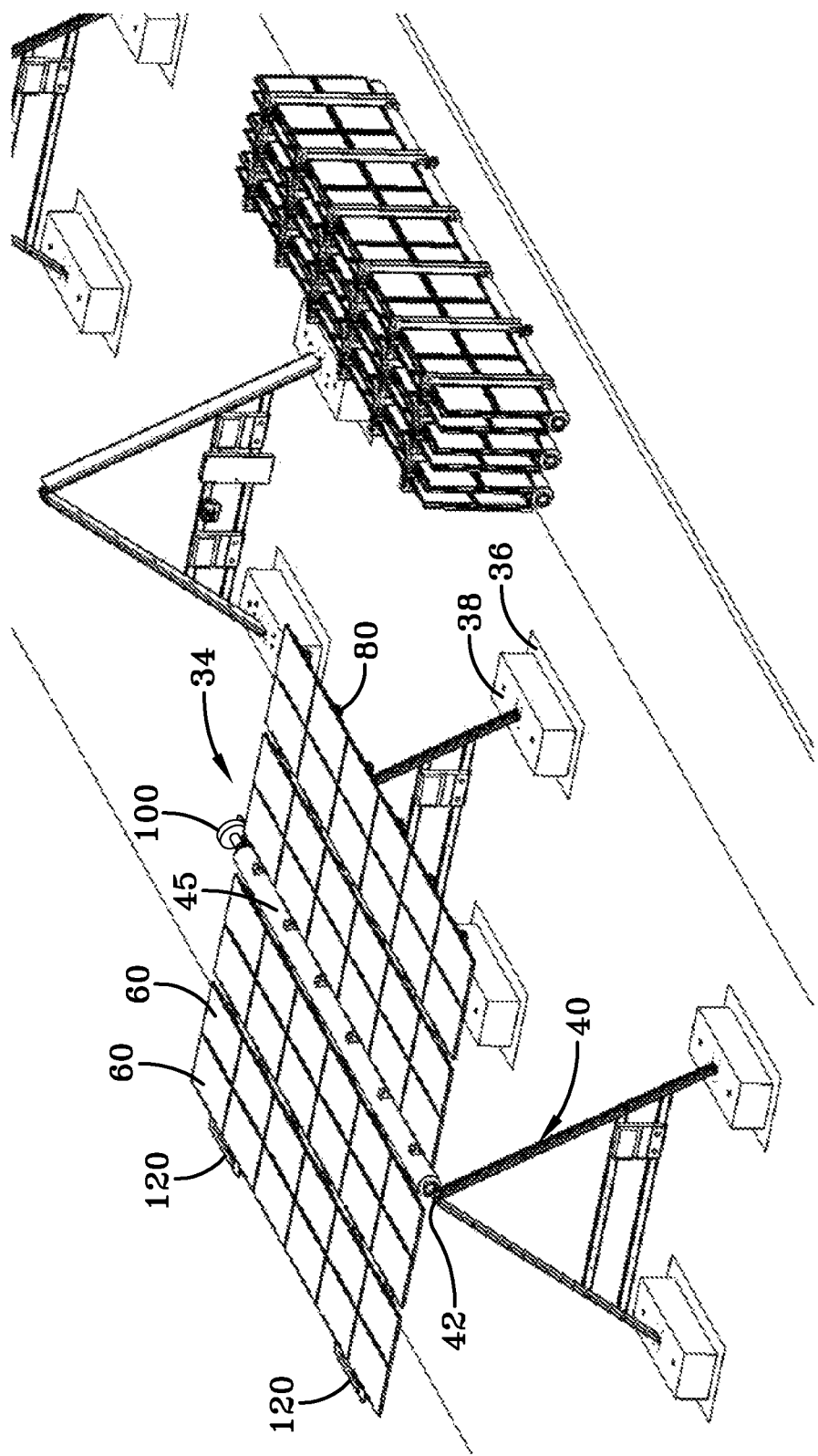
FIG. 15 is a perspective drawing showing the solar tracking array and in particular, the spine positioned on adjacent A-frame support assemblies.

As seen in FIG. 14, the outer array arms 80 are unfolded so that the solar panels originally facing one another for shipping now face skyward so that they are all in a relatively planer condition with respect to one another. This is done by moving the outer array arm 80 at the hinge 90. In some embodiments this may be done by un-fastening or loosening connections between the hinge 90 and the arm 80 and possibly even the arm 78. Once the arms 78 and 80 are in their desired position, the connections to the hinge 90 are re-fastened. The spine 44 is then lifted so as to be received on the apex receptacles 42 of the adjacent A-frame sections 40, as best seen in FIG. 15. At this time, a drive assembly 100 is assembled to one end of the spine 44. Of course, the drive assembly 100 may attach to the spine at most any other time in the assembly process.

Figure 16:
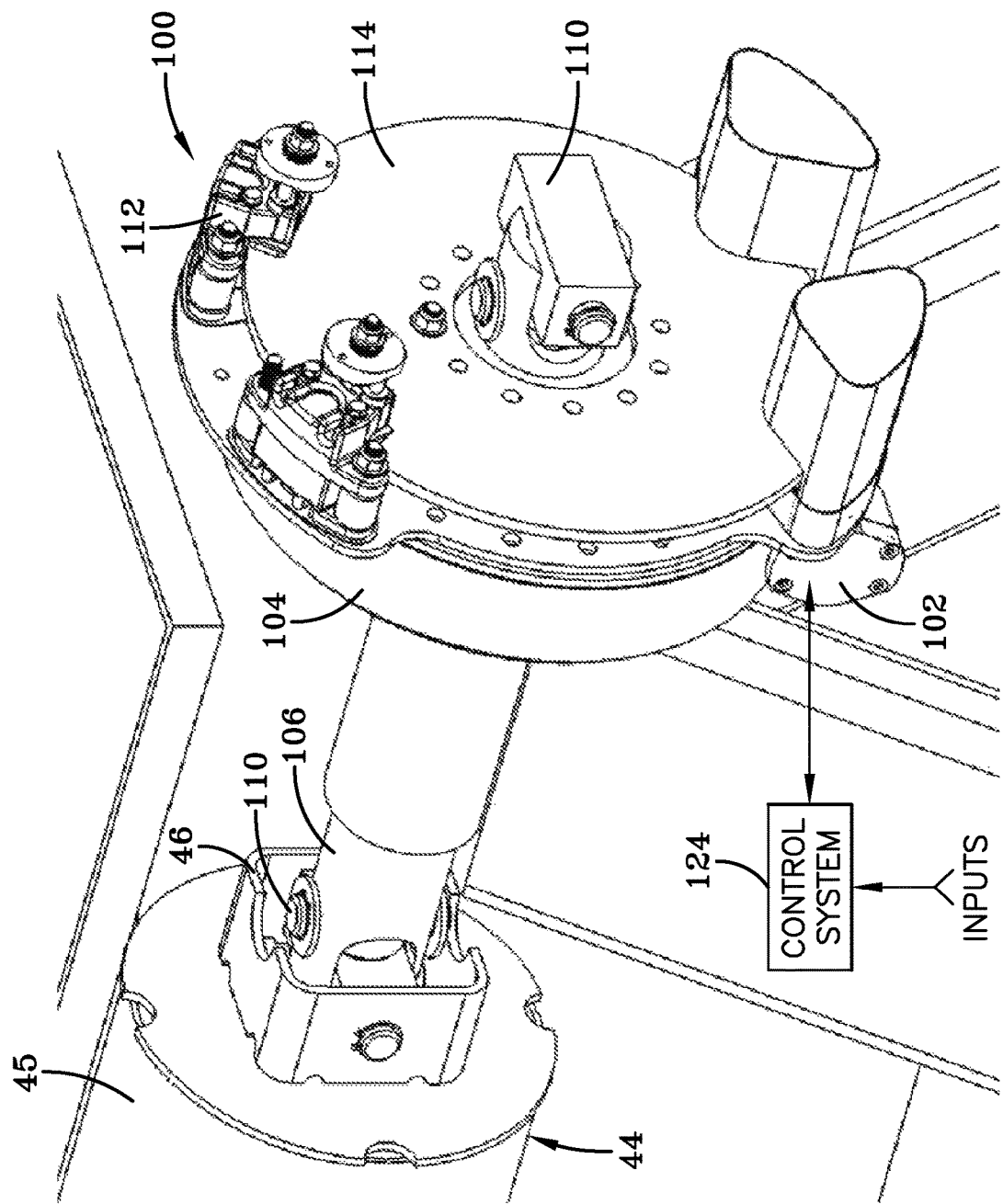
FIG. 16 is a perspective drawing of a driving assembly and a slip clutch used by the solar tracking array according to the concepts of the present invention.

As seen in FIG. 16, the drive assembly 100 includes a reversible drive motor 102 and an associated gear box 104. A drive shaft 106 extends axially from each side of the motor 102. Each distal end of the drive shaft 106 includes a universal joint 110 that connects to an end of the adjacent spine 44. In particular, the universal joint 110 is coupled or otherwise linked to the extending tube 46 of the cylindrical member 45. Accordingly, the solar panel arrays are interconnected to one another via the drive shaft 106 and universal joints 110 which enable multiple arrays on either side of the drive assembly 100 to be rotationally driven as a whole unit to track the sun. Skilled artisans will appreciate that the universal joints allow the ballast blocks and hence arrays to be mis-aligned vertically and horizontally so that leveling of the terrain is not a requirement for installation. The drive assembly 100, incorporates an adjustable slip clutch 112 that clamps a driven disk 114 which when used in conjunction with a plurality of winglets 120 (see FIGS. 17 and 18) allow wind, snow or ice accumulating or bearing on the array to passively "Auto Furl" thus lowering load on the structure, as will be discussed as the description proceeds. The winglets 120 may be installed at any time during the assembly of solar panel assembly 30.

Figure 17:
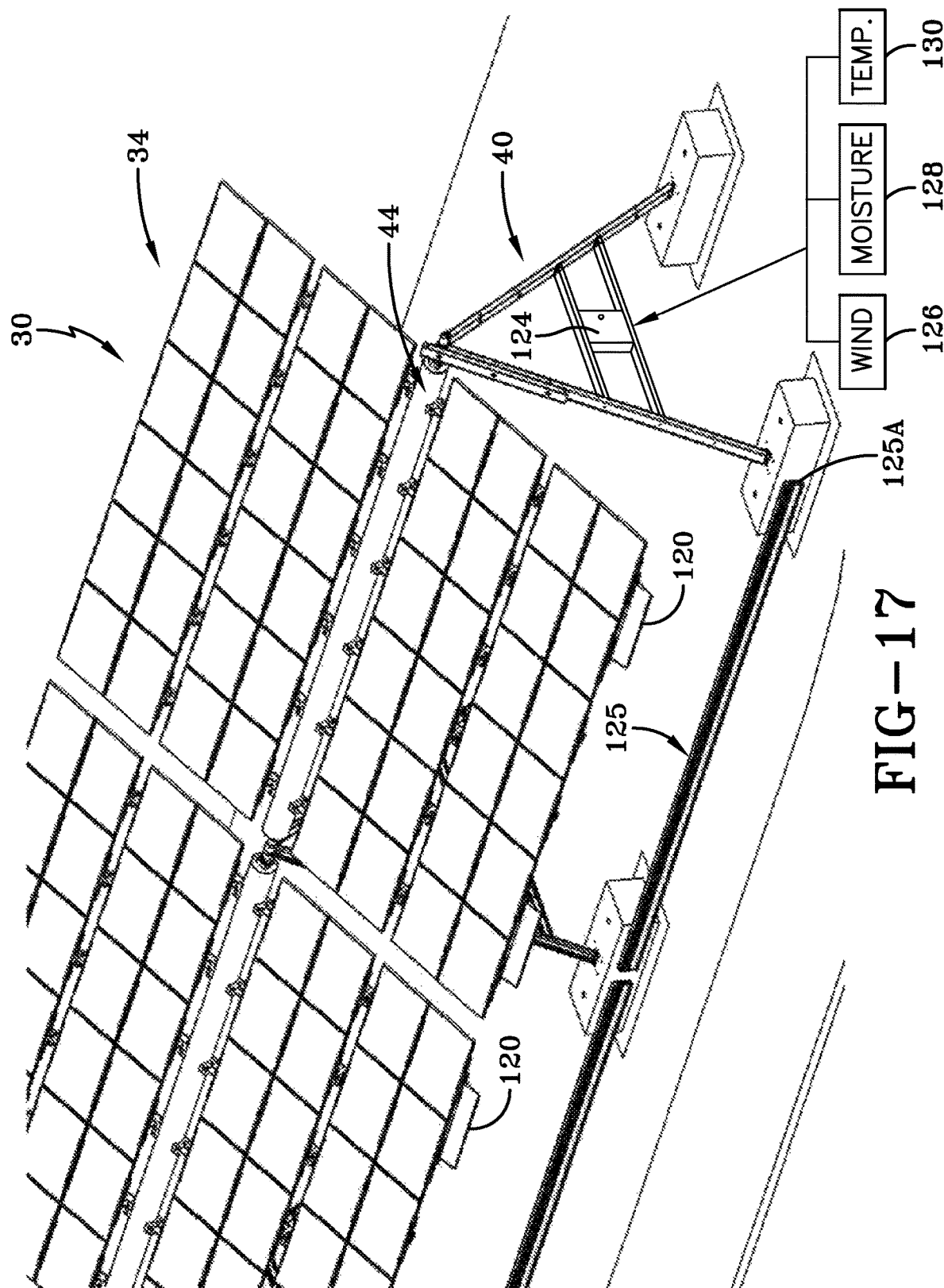
FIG. 17 is a perspective drawing of a solar tracking array employed with a control system according to the concepts of the present invention.
Figure 18:
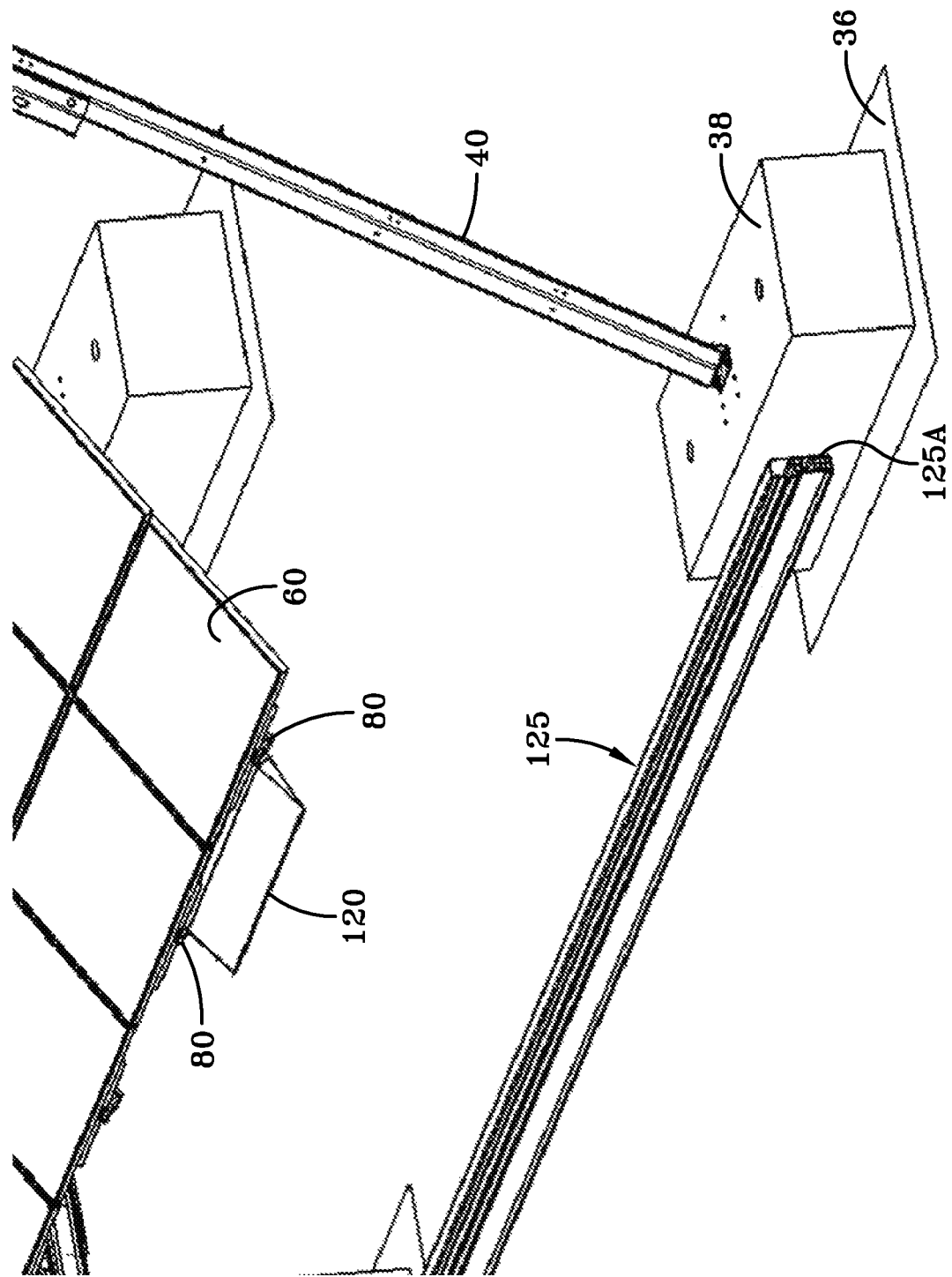
FIG. 18 is a detailed perspective view of a wire trough and winglet associated with the solar tracking array according to the concepts of the present invention.

As best seen in FIGS. 17 and 18, a winglet 120 is attached to and between two adjacent outer array arms 80. The winglets 120 function to displace the center of pressure from the center of rotation, thus providing a differential torque to a surface of the solar tracking array 34 when it is loaded by wind, snow, or ice, thus providing the ability for the array to pitch horizontal to the wind, thereby lowering the force imparted to the structure. In the case of snow or ice, the differential torque allows the array to rotate to a 90 degree angular position relative to the ground which allows the snow or ice to "auto-dump" thereby passively lowering the load on the array and its supporting structure. In either the Auto-Furl or Auto-Dump operation, a control system 124, which operates the drive assemblies 100 so that the arrays 34 track the sun, is programmed to return the tracking array 34 to active sun tracking after a pre-programmed wait time. As seen in FIGS. 17 and 18, a wiring system 125 for the installed solar panel assembly utilizes an above-ground wire trough 125A that is supported by ballast blocks 38, thereby avoiding the use of ground trenches which can be overly costly if rock or boulders are encountered. These wire troughs 125A can additionally be supported by means of intermediate cast stairs which enable workers to easily traverse the cable trough or by intermediate posts, driven into the ground to support the cable trough.

In some embodiments a wind sensor such as an anemometer 126 is coupled anywhere on or in proximity to the assembly 30. Data from the wind anemometer 126 is sent to the control system 124. If an excessive amount of wind is detected, then the slip clutch 112 passively disengages the driven disk 114 from the drive motor 102 so as to allow the spine to rotate so that the wind forces applied to the solar array panels are reduced. Once the wind forces are below a predetermined threshold, the drive assembly 100 returns the solar panel assembly to normal sun tracking operation.

In another embodiment a moisture sensor 128 and a temperature sensor 130 are coupled anywhere on or in proximity to the assembly 30. In some embodiments, the sensors 128 and 130 may be combined to form an ice sensor. In any event, data from the sensors 128 and 130 are sent to the control system. If values of the sensors 128 and 130 are indicative of ice and/or snow conditions, then the drive assemblies are activated so as to override the normal sun tracking operation of the drive assembly and rotate the spine so that any snow and/or ice that accumulates on the solar array panels is dumped or otherwise removed from the surface of the panels or does not even accumulate since the solar panel array is positioned 90 degrees to the falling snow.

Figure 19:
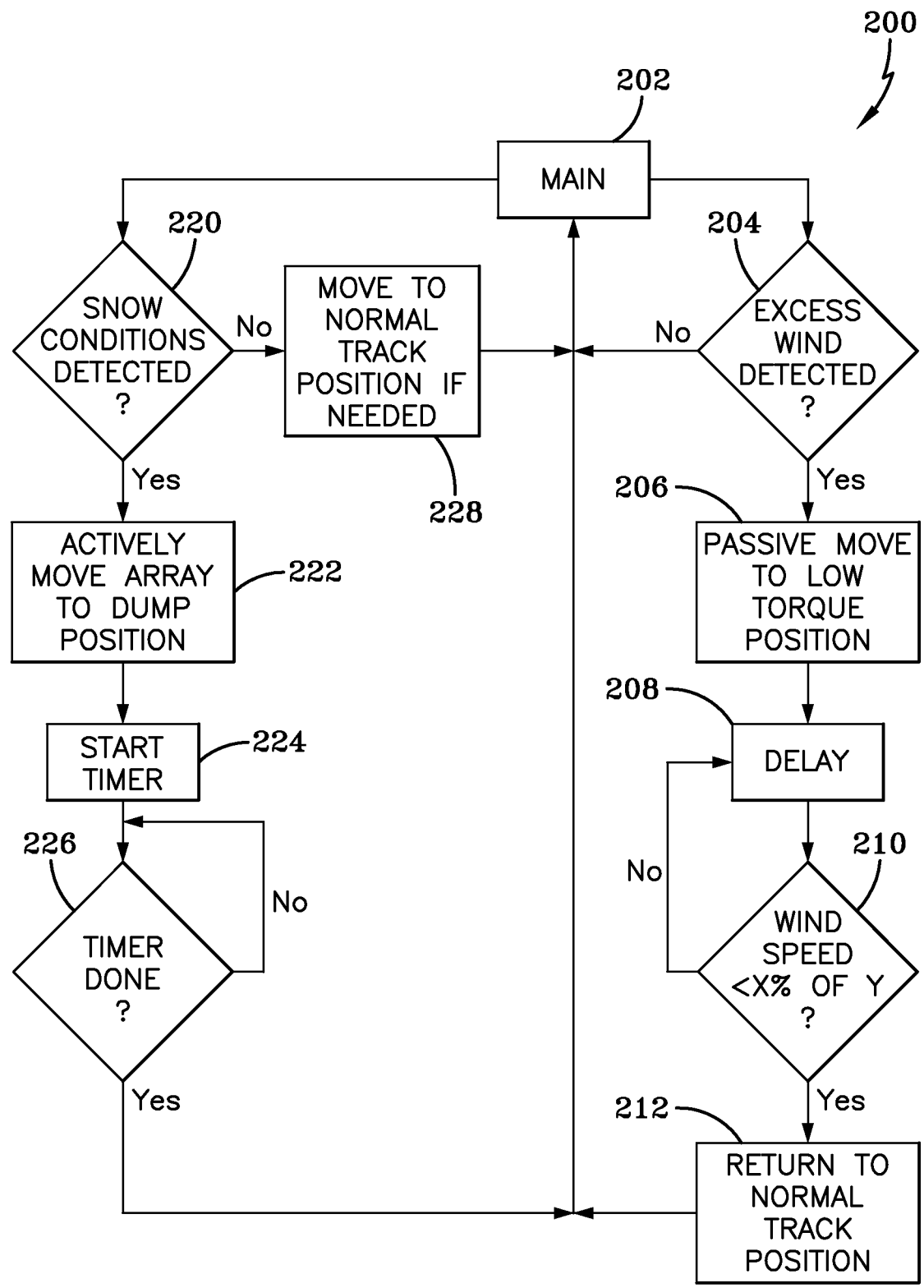
FIG. 19 is an operational flow chart utilized by the control system to operate the solar tracking arrays in wind and snow conditions according to the concepts of the present invention.

Referring now to FIG. 19, it can be seen that a method of operation of the solar panel assembly is designated generally by the numeral 200. In the main operation routine 202 it will be appreciated that during normal weather conditions the solar panel assembly and in particular the solar tracking array 34 is programmed to track and/or follow the position of the sun so as to maximize generation of electricity during daylight hours. In other words, at sunrise the solar tracking array is tilted to obtain maximum exposure of sunlight on all of the solar array panels. As the sun traverses the sky, the driving assembly 100 is programmed to rotate the spine in a like fashion so as to maintain maximum exposure of the solar panels to the sun. However, in certain weather conditions, it is desirable to adjust the angular orientation of the solar tracking array so as to prevent damage to the assembly 30. In particular, the main sub-routine 202 periodically checks at step 204 as to whether excess wind is detected or not. If not, then the process returns to the main sub-routine 202. However, if at step 204 excess wind is detected, then the slip clutch 112 passively disengages from the driven disk 114 and allows the solar tracking array 34 to partially deflect so as to minimize the wind forces on the solar tracking array. Skilled artisans will appreciate that this is a passive reaction and as such does not require input from the control system to implement such a change. This allows for severe or extreme wind gusts to be dealt with immediately instead of waiting for the control system to make a determination as to whether the tracking array should be positionally adjusted or not. Next, at step 208, a delay is implemented by the control system such that after detection of a movement in the array by the slip clutch, the control system makes a determination of wind speed at step 210. This wind speed determination may be based on the data received from the wind sensor 126. In particular, the control system determines whether the wind speed is at a particular percentage of a predetermined maximum wind speed encountered. If the wind speed is not at a desired value (the allowable threshold for letting the solar panel array return to its original position) then the process returns to step 208 until such time that the wind speed is determined to be low enough. When this occurs, then the methodology proceeds to step 212 and the control system returns the solar tracking arrays to their normal tracking position and at the appropriate time the process returns to the main sub-routine 202.

The main sub-routine 202 also makes a determination as to whether conditions are such that snow will accumulate on the solar panel arrays. Accordingly, at step 220 the methodology determines whether snow conditions are detected or not. These conditions are determined by input received by the control system 124 from the moisture sensor 128 and the temperature sensor 130. If it is determined that moisture is detected and the temperature is at or close to the freezing point, then the process continues to step 222. At this time, the control system actively moves the solar tracking array 34 to a dump position at step 222. The dump position typically orients the solar array 90 degrees to the ground so as to ensure that any snow deposited on the solar panel array is likely to fall from the surfaces of the solar panels or not even accumulated. Next, at step 224 a timer is started by the control system and after a predetermined delay, as determined by step 276, the process returns to the main sub-routine 202. The process then continues with the sub-routines for wind detection and also snow detection such that step 220 is repeated again and if snow conditions are once again detected then the steps 222, 224 and 226 are repeated. However, if no snow conditions are detected at step 220 then the control system moves the solar tracking arrays 34 to a normal track position at step 228.

Figure 20:
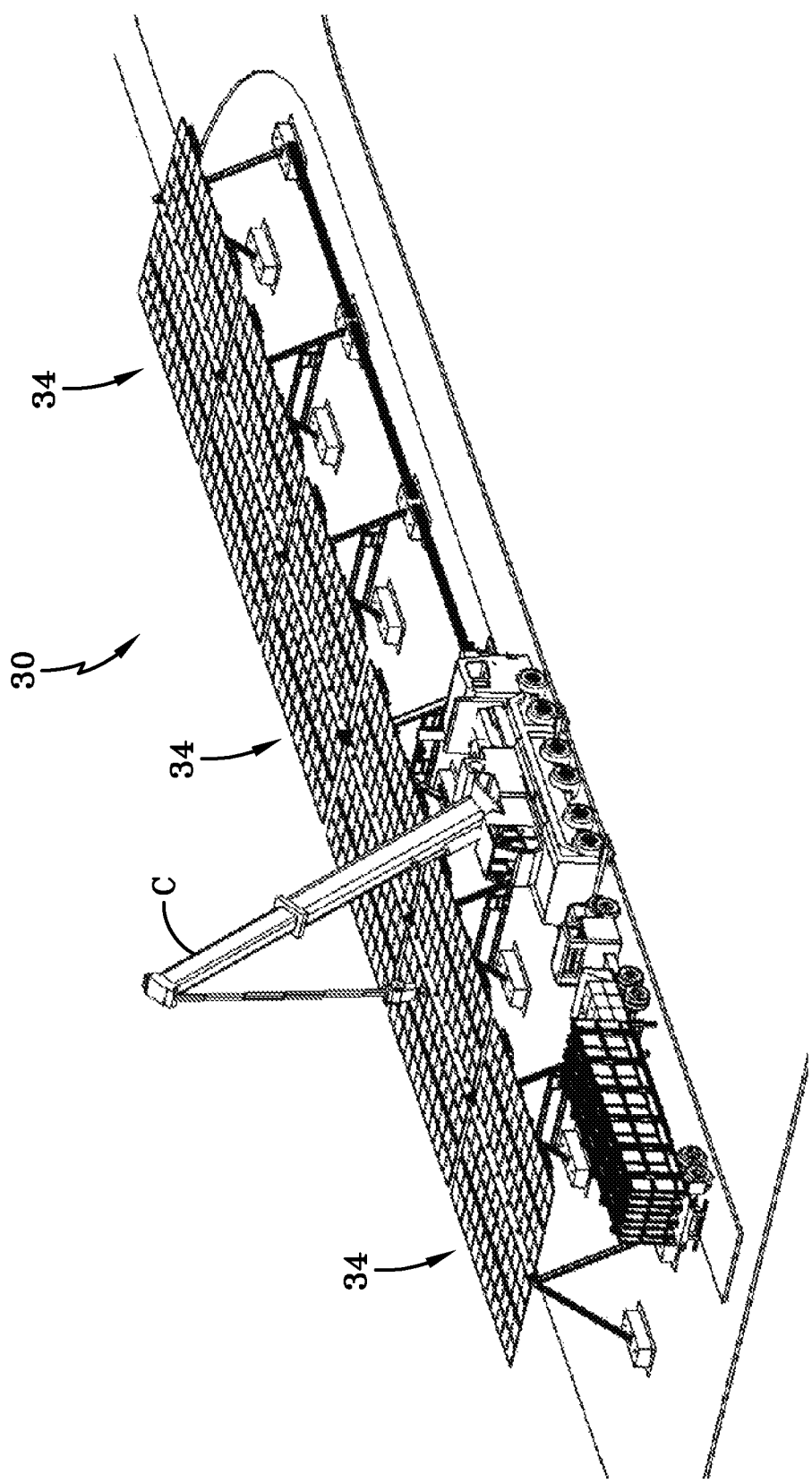
FIG. 20 is a perspective view of a mobile crane lifting a solar tracking array into position on an A-frame support assembly.
Figure 21:
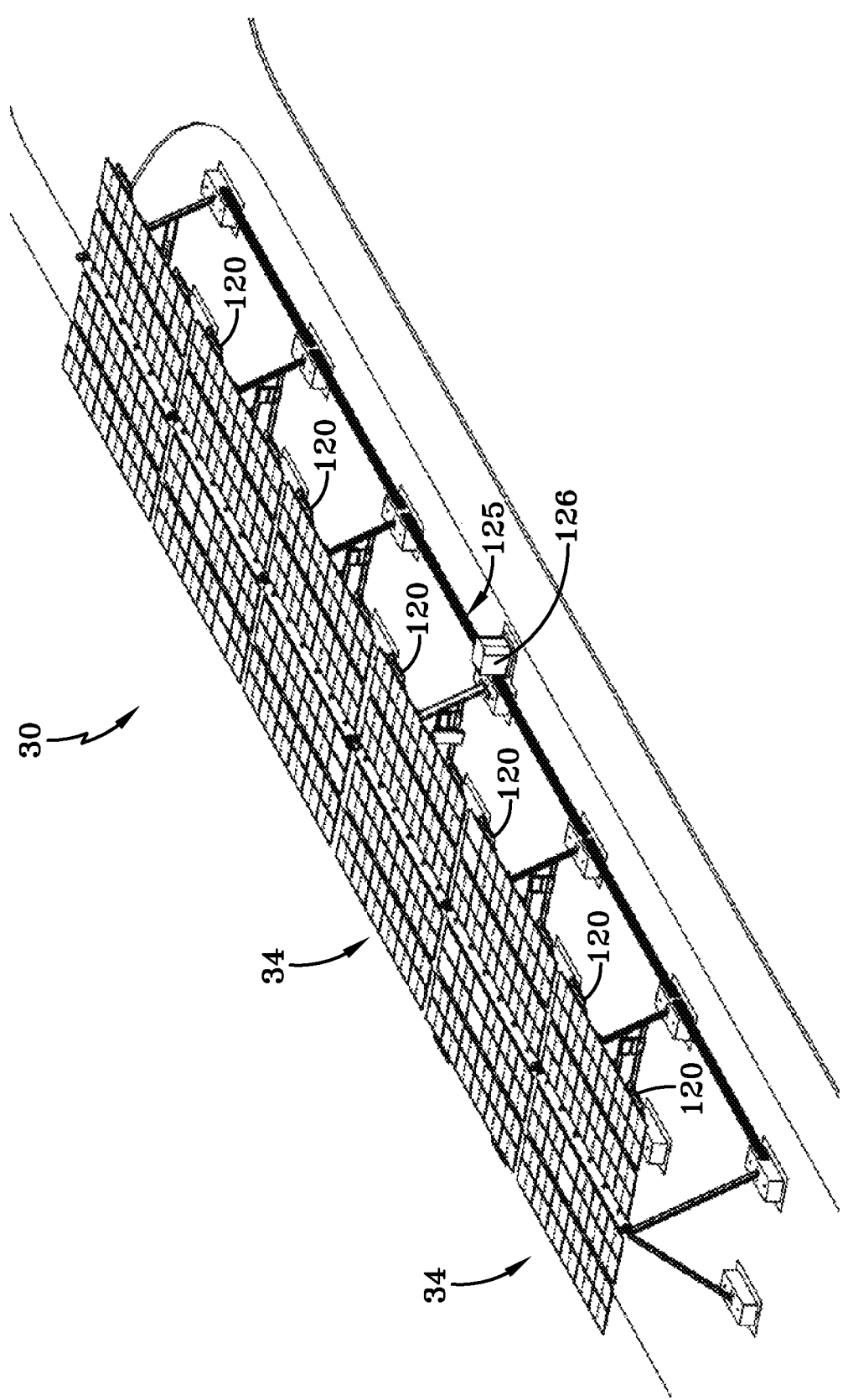
FIG. 21 is a perspective view of a completed solar panel assembly with the solar panels situated substantially parallel to the ground, that is with 0 degree tilt.

Lifting of the arrays, as shown in FIG. 20, may be accomplished by utilizing a crane designated generally by the capital letter C. The crane lifts all of the arrays 34 into the appropriate positions onto the A sections 40. After installation, the solar array panels 60 are electrically connected to the appropriate bus wires for connection to a power grid or other electrical generating power substation or a power transformer 126 as shown in FIG. 21.

Figure 22:
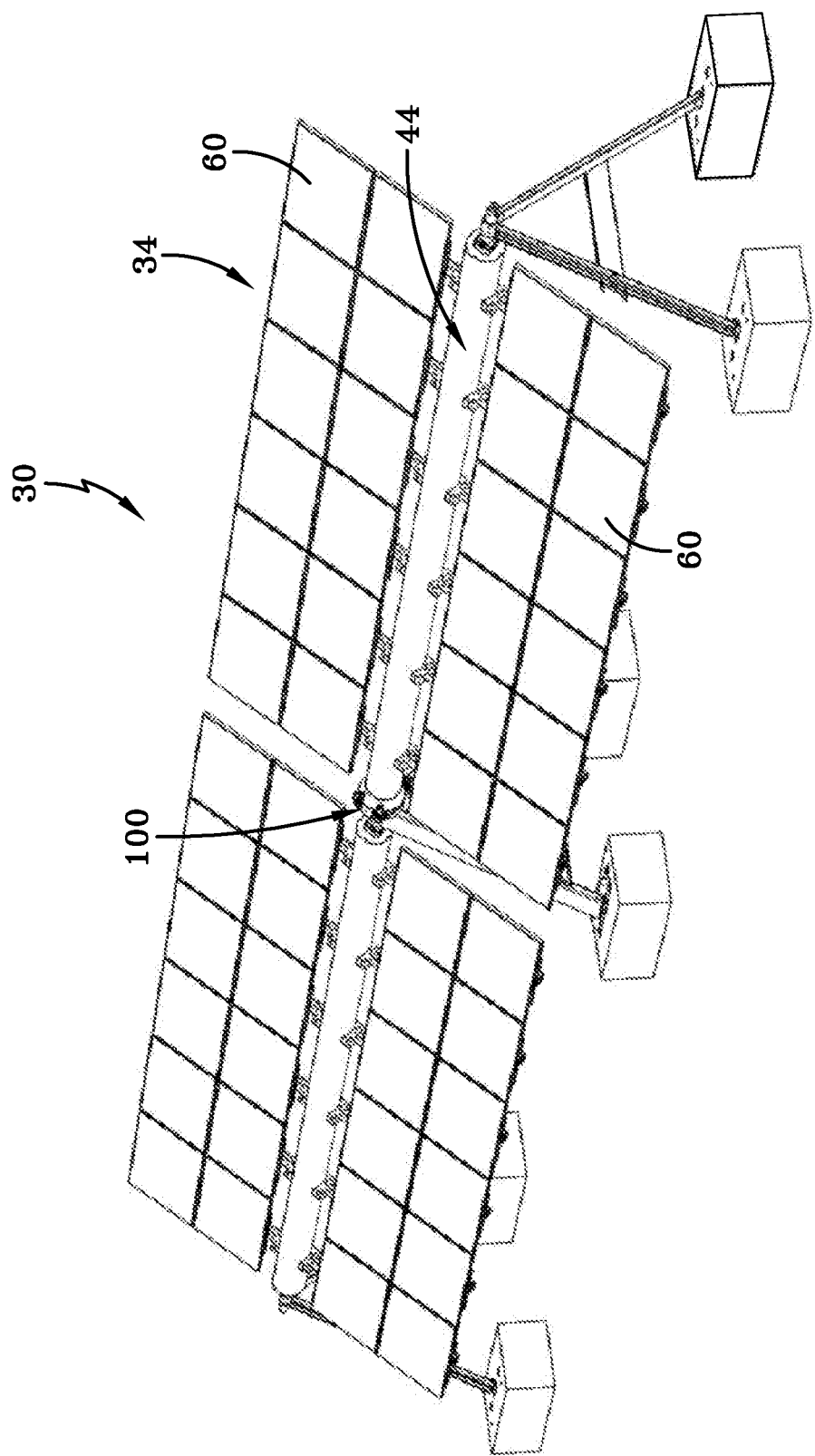
FIG. 22 is a perspective view of a partial solar panel assembly with the solar panels situated at about a 60 degree tilt according to the concepts of the present invention.

For reference, the solar panel array 34 with solar panels secured to the inner array arms 78 is shown in FIG. 22. It will be appreciated that the outer array arms 80 and the corresponding hinge 90 are not shown in this particular embodiment.

Referring now to FIGS. 23-28 an alternative installed solar panel assembly, referred to as a tilt axis solar tracker, is designated generally by the number 300. The assembly 300 is similar to the previous embodiment in that it utilizes a spine 44 wherein the solar panel arrays and array arms are secured to the spine and allow for folding out and deployment of the solar panels as previously described. The tracker 300 may also be provided with a spine 44 that includes caster brackets 52 as in the other embodiment so as to facilitate shipping and assembly.

Figure 23:
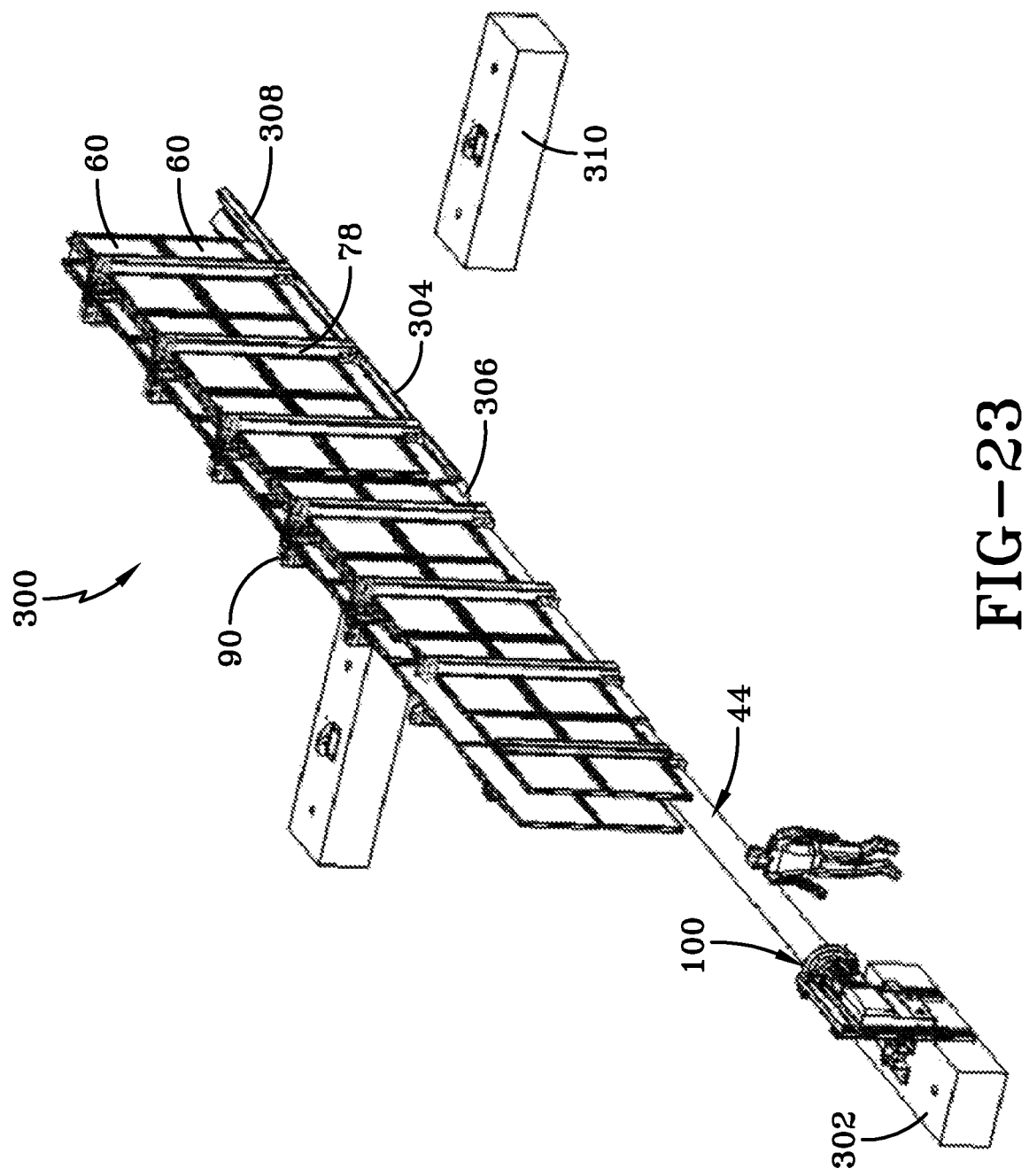
FIG. 23 is a perspective view of an alternative solar panel assembly according to the concepts of the present invention wherein a single solar tracking array has one end positioned on a ballast pad and wherein the tracking array is shown in a folded position according to the concepts of the present invention.

In this embodiment, the assembly 300 utilizes a pivot ballast block 302 and two support legs 304 that are connected to the cylindrical member 45 in a way so as to allow rotation about the axis of the spine and also allow pivoting on an axis skew to the spine with a drive mechanism that is connected in line with the spine. The support legs 304 include an array end 306 that is attached to the spine and a ground end 308 that is rigidly attached to a corresponding ballast block 310. Skilled artisans will also recognize that the ballast blocks for either embodiment may be replaced by poured in place concrete pads or blocks, helical ground anchors or driven piles, or similar ground attachments. As best seen in FIG. 23, the spine and attached solar panels are initially positioned so as to allow for attachment of the spine 44 to the pivot ballast block 302. The connection at block 302 allows for pivoting motion only. The drive assembly 100 as depicted in FIG. 16 and FIG. 23 also incorporates an adjustable slip clutch 112, the driven disk 114 and the control system 124 that work together with the winglets 120 to facilitate passive and/or active computer controlled rotation of the spine about its axis as it tracks the sun and Auto-Furls to the wind and Auto-Dumps when snow and ice are detected as described in the previous embodiment.

Figure 24:
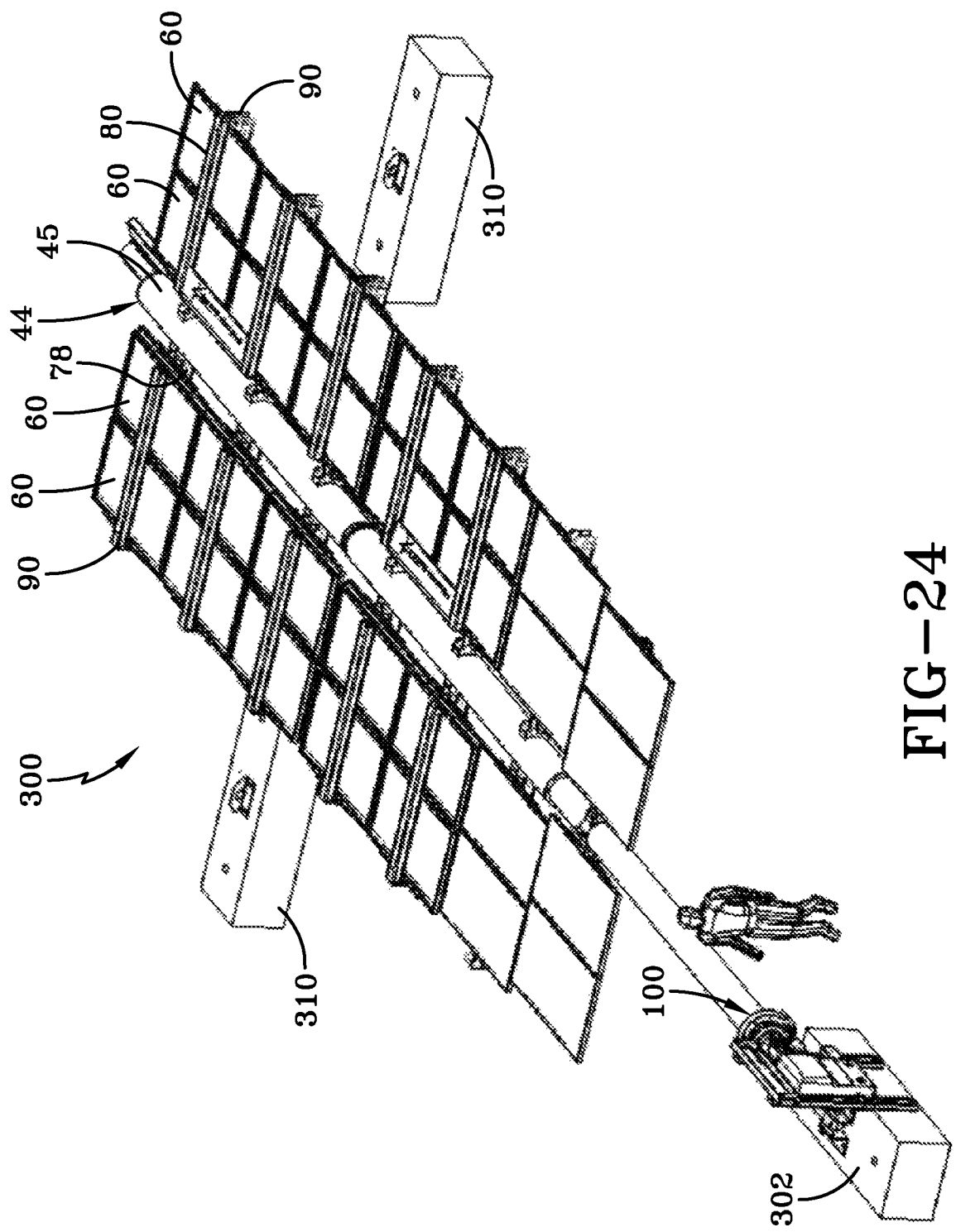
FIG. 24 is a perspective view of the alternative solar panel assembly partially unfolded.
Figure 25:
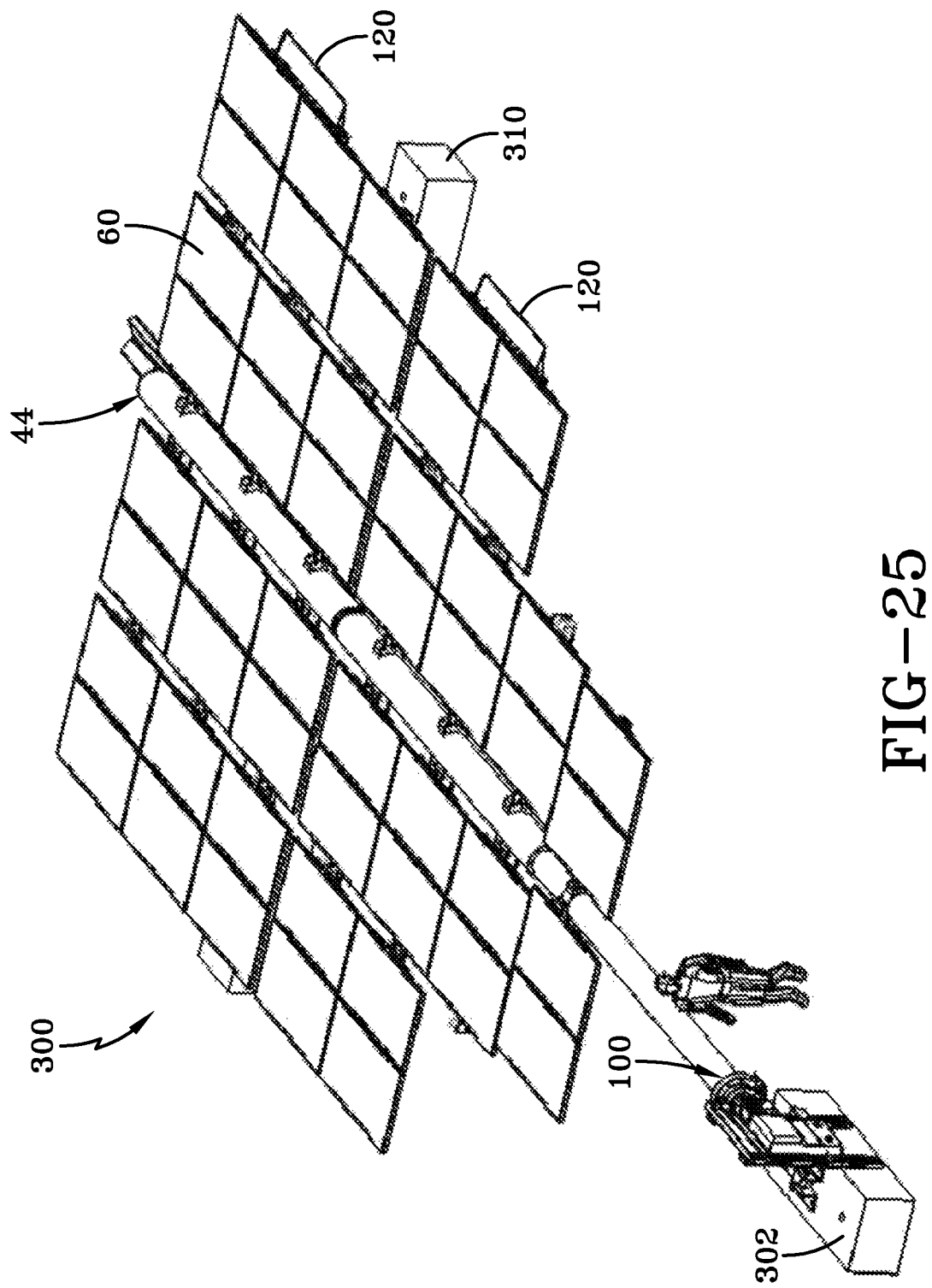
FIG. 25 is a perspective view of the alternative solar panel assembly fully unfolded.
Figure 26:
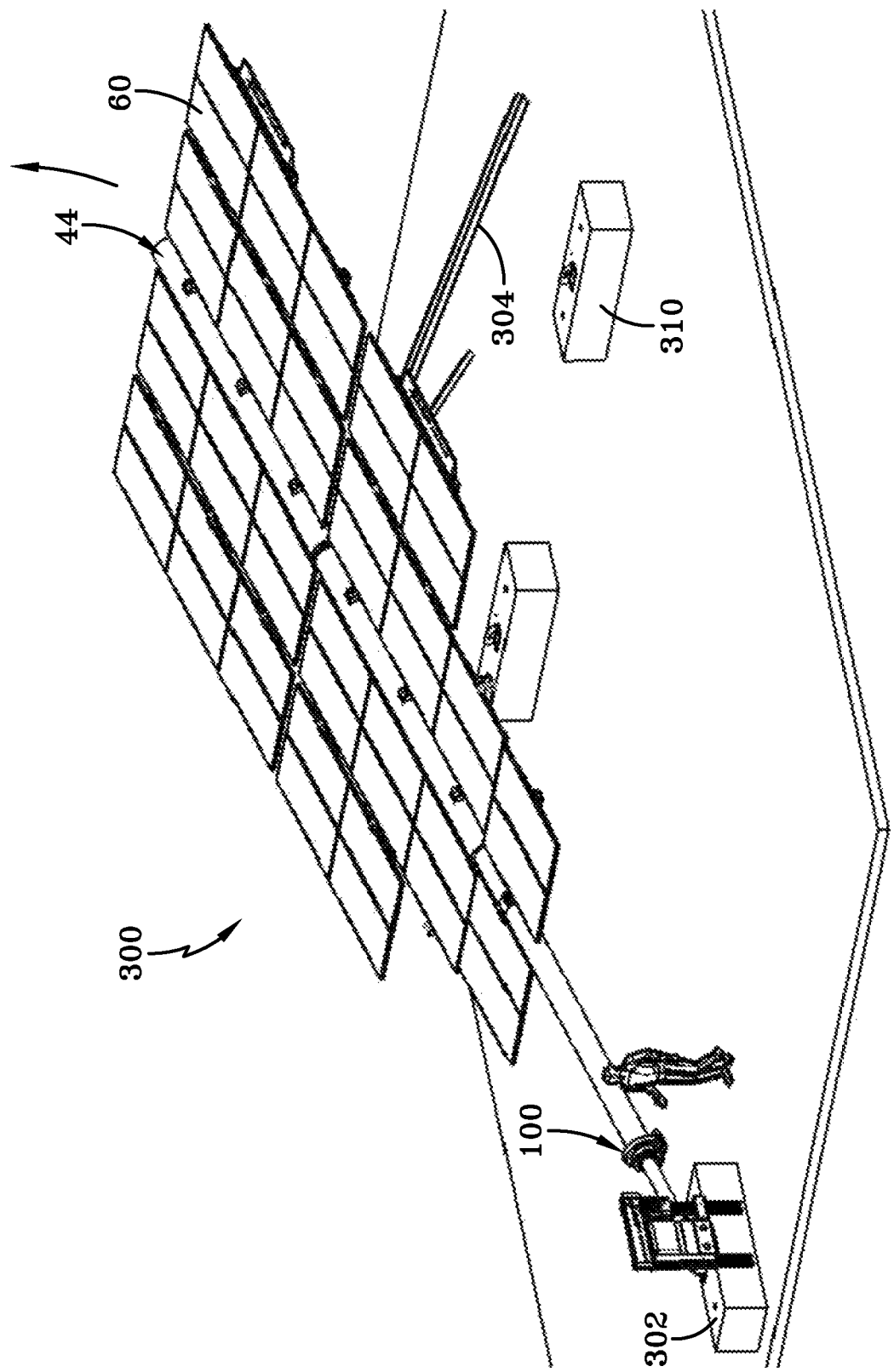
FIG. 26 is a perspective view of the alternative solar panel assembly partially lifted.
Figure 27:
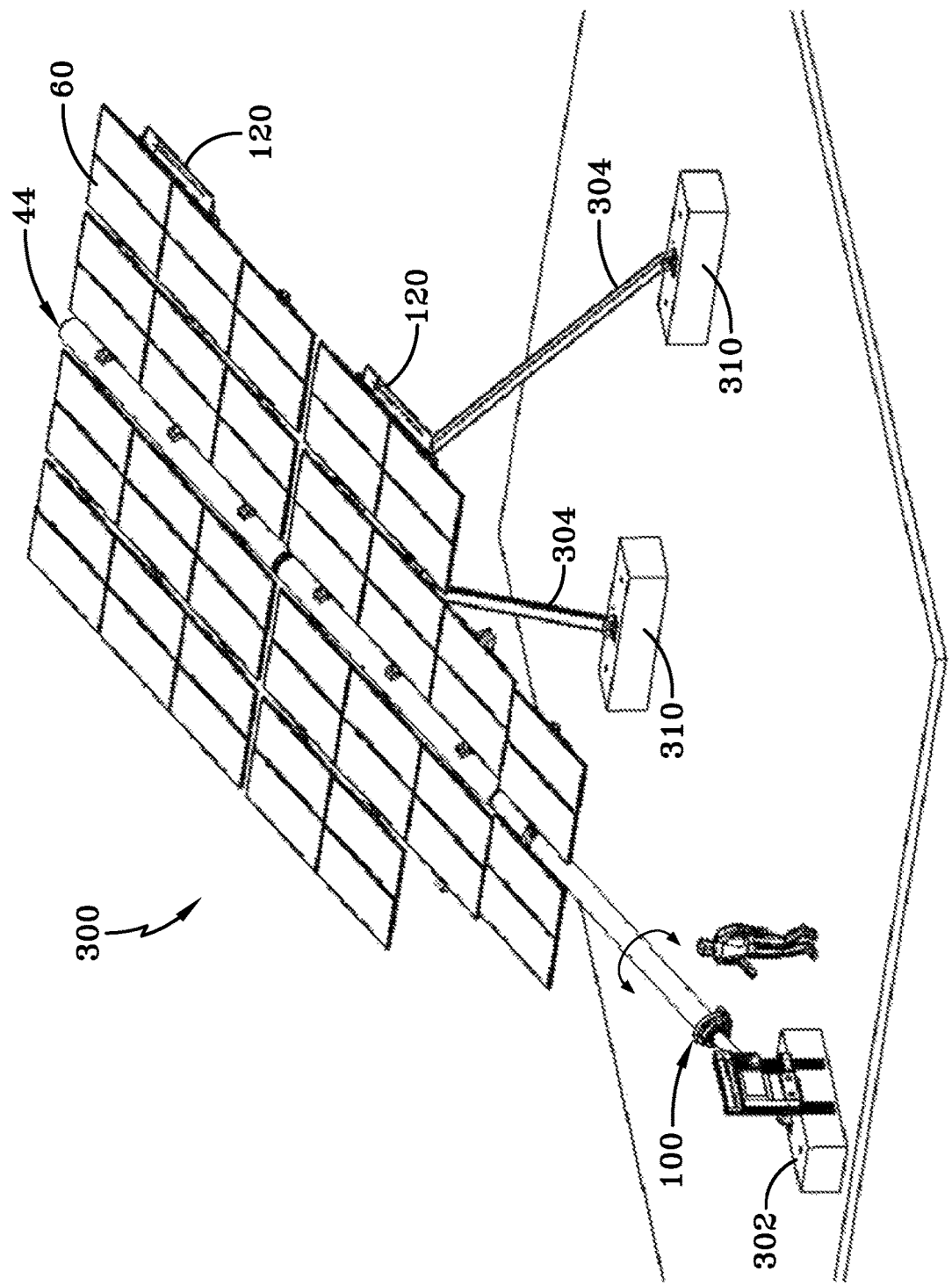
FIG. 27 is a perspective view of the alternative solar panel assembly fully lifted with associated support legs connected to ballast blocks in a solar noon or 0° position.
Figure 28:
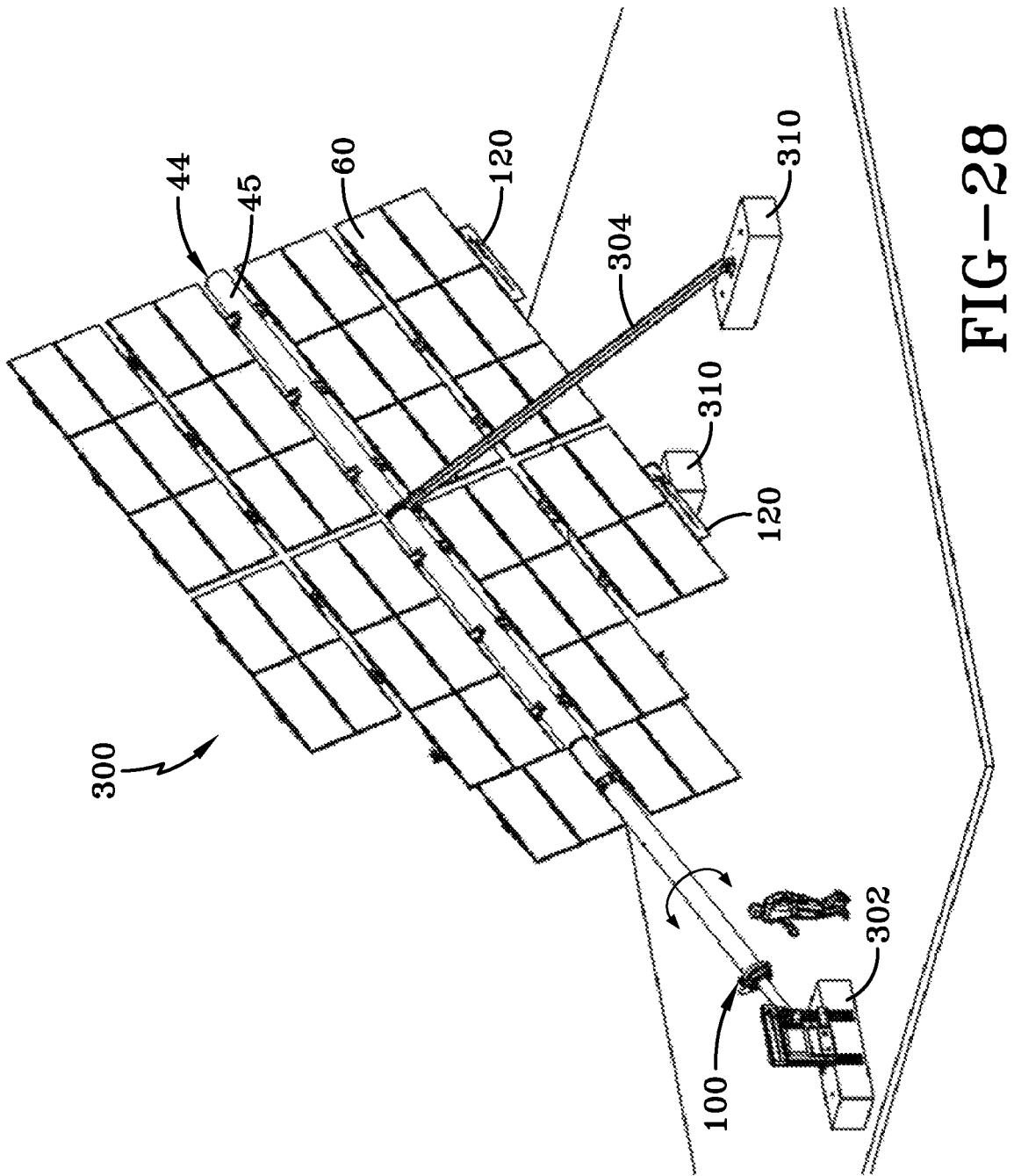
FIG. 28 is a perspective view of the alternative solar panel assembly shown in a fully tilted 90° or snow dump position.

After attachment of the spine to the block, and as seen in FIG. 24, the solar panels and array arms are folded out and then in FIG. 25 the hinged portions of the panels are further unfolded so as to fully deploy the outer array arm 80 and the associated solar panels. As seen in FIG. 26, as the spine is lifted into position pivoting about the pivot ballast block 302 and the supports legs are positioned for rigid connection to the ballast blocks 310 as shown in FIG. 27. FIG. 28 shows the tilt axis sun tracker in the Auto-Dump position with the array oriented in a position 90 degrees to the ground. Skilled artisans will appreciate that there is sufficient spacing between the arrays 60 to allow passage of the leg 304 therebetween during the Auto-Dump rotation.

Based upon the foregoing, the advantages of the present invention are readily apparent. In particular, both embodiments and related features provide for a foldable array so as to allow for economic pre-assembled shipping of the solar panel arrays. The folding design and mono array arm solar panel mounting uses a minimum number of fasteners and structural members to support the solar panels in contrast to the known prior art. The configurations are further advantageous in that the central spine serves as an assembly and shipping fixture as well as a structural support. By utilizing these features, individual solar panels are not field-handled resulting in huge in-field labor savings and time savings. It is believed that the embodiments described are 90% assembled and only require unfolding and then attachments as to provide for a quickly and efficiently installed solar panel array in comparison to prior art configurations. The one-sided winglets 120 and adjustable slip clutch 112 enable passive "furling"—rotating to orient lowest panel area to wind and to auto-dump snow in winter, thereby dramatically lowering ballast size needed for stability and structural member sizing.

It is estimated that the embodiments described substantially reduce the installed cost of a solar park comprising any number of solar tracking arrays. These embodiments reduce construction risks by requiring no ground penetration for electrical and control cabling or solar tracker mounting and allows for speeding the solar park deployment by many fold. It is also believed that such sun tracking configurations provide up to a 25% improvement in energy captured for a similar installed cost compared to fixed tilt solar panel mountings. It is further believed that such configurations can eliminate solar panel packaging since panels can be cost effectively shipped preassembled from the solar panel plant to the deployment site, thereby avoiding costly additional logistic steps.

Thus, it can be seen that the objects of the invention have been satisfied by the structure and its method for use presented above. While in accordance with the Patent Statutes, only the best mode and preferred embodiment has been presented and described in detail, it is to be understood that the invention is not limited thereto or thereby. Accordingly, for an appreciation of the true scope and breadth of the invention, reference should be made to the following claims.

What is claimed is:

1. A solar tracking assembly comprising:
   a spine;
   a plurality of first brackets fixedly coupled along a first line to a first side of the spine and a plurality of second brackets fixedly coupled along a second line to a second side of the spine opposite the first side, an axis of the spine between the first side and the second side; and
   a plurality of solar panel sub-assemblies, each solar panel sub-assembly comprising:
      a first array arm having a first end and a second end, the first end rotatably connected to the spine;
      a second array arm hingedly connected to the second end of the first array arm;
      a first solar array panel connected to the first array arm; and
      a second solar array panel connected to the second array arm;
   wherein each first array arm of the plurality of solar panel sub-assemblies is independently foldable between a shipping configuration and a deployed configuration;
   wherein a first set of at least two of the plurality of solar panel sub-assemblies are each rotatably connected to a corresponding first bracket of the plurality of first brackets fixedly coupled to the spine at a same location between the shipping configuration and the deployed configuration;
   wherein a second set of at least two of the plurality of solar panel sub-assemblies are each rotatably connected to a corresponding second bracket of the plurality of second brackets fixedly coupled to the spine at a same location between the shipping configuration and the deployed configuration;
   wherein, in the deployed configuration, the first and second solar array panels of the first set are coplanar with one another, and the first and second solar array panels of the second set are coplanar with one another; and wherein, in the shipping configuration, the first solar array panels connected to the first array arm of the first set are coplanar with one another, and are parallel with and non-coplanar with the second solar array panels connected to the second array arm of the first set.

2. The assembly according to claim 1, wherein, in the shipping configuration, at least one of the plurality of solar panel sub-assemblies comprises a first side of the first solar array panel connected to the first array arm facing a first side of the second solar array panel connected to the second array arm.

3. The assembly according to claim 1, wherein the spine has a first end and a second end opposite the first end, the assembly further comprising:
a plurality of support assemblies, each said support assembly having a receptacle configured to rotatably receive at least one of the first end and the second end of the spine.

4. The assembly according to claim 3, further comprising:
a plurality of ballast blocks configured to:
support said plurality of support assemblies; and
support a trough system configured to carry electrical control cables for the assembly.

5. The assembly according to claim 3, further comprising:
a drive assembly coupled to an end of said spine and configured to be carried by one of said support assemblies, said drive assembly configured to rotate said spine so that at least one solar array panel of the first and second solar array panels is configured to track movement of the sun.

6. The assembly according to claim 5, wherein said drive assembly comprises an adjustable drive-slip clutch configured to allow regulated rotatable movement of said spine.

7. The assembly according to claim 6, further comprising a winglet secured to said at least one solar array panel, the winglet configured to displace a center of pressure of the assembly from a center of rotation of the assembly sufficient to cause said adjustable drive-slip clutch to passively disengage to rotate the solar array panel to a minimum structural loading position.

8. The assembly according to claim 1, further comprising:
a universal joint attached to an end of said spine to allow the assembly to be connected to an adjacent solar tracking assembly.

9. The assembly according to claim 1, further comprising:
a plurality of wheeled caster brackets attached to the spine to allow rolling movement of said spine.

10. A solar tracking assembly, comprising:
a spine having a center axis positioned between a first side of the spine and a second side of the spine opposite the first side, wherein the center axis, the first side, and the second side extend along an elongated length of the spine;
a plurality of solar array panels comprising:
a first set of solar array panels extending from the first side of said spine, and
a second set of solar array panels extending from the second side of said spine;
a motor having a slip clutch, said motor connected to said spine for rotation of said spine; and
at least one winglet attached to at least one solar array panel on only the first side of the spine, the at least one winglet having a loading surface extending away from the spine to provide more surface area on the first side of the spine than the second side of the spine to displace a center of pressure of the assembly from a center of rotation of the assembly sufficient to cause the slip clutch to passively disengage to rotate the spine which rotates the plurality of solar array panels about the center axis of the spine to a minimum structural loading position.

11. The solar tracking assembly according to claim 10, further comprising:
a wind sensor positioned proximal to the tracking assembly, said wind sensor configured to generate a wind speed data; and
a control system configured to receive said wind speed data and control operation of said motor, said control system configured to operate said motor so as to return said spine to a predetermined tracking position when said wind speed data reaches a predetermined threshold.

12. The solar tracking assembly according to claim 10, further comprising:
a snow sensor positioned proximal to the tracking assembly, said snow sensor configured to generate snow data; and
a control system configured to receive said snow data and control operation of said motor, said control system configured to operate said motor so as to rotate said spine and said solar array panels to an angle sufficient to dump snow therefrom.

13. The assembly according to claim 9, wherein each said plurality of wheeled caster brackets is connected to one of the plurality of first brackets or one of the plurality of second brackets.

14. The solar tracking assembly of claim 10, wherein the winglet is further configured to:
apply a torque to the slip clutch in response to wind force to passively disengage the slip clutch; and
urge the at least one of the plurality of solar panels to pitch horizontal to the wind force.

15. The assembly of claim 1, wherein, for each solar panel sub-assembly of the plurality of solar panel sub-assemblies, the first array arm is independently foldable with respect to the second array arm.

16. A solar panel assembly comprising:
a spine;
a plurality of first brackets fixedly coupled along a first line to a first side of the spine and a plurality of second brackets fixedly coupled along a second line to a second side of the spine opposite the first side;
a plurality of folding arm assemblies coupled to the spine, each of the plurality of folding arm assemblies being foldable independently of each other between a shipping configuration and a deployed configuration, each of the plurality of folding arm assemblies comprising at least two arms;
wherein a first set of at least two of the plurality of folding arm assemblies are rotatably connected to a corresponding first bracket of the plurality of first brackets fixedly coupled at a same location to the spine between the shipping configuration and the deployed configuration;
wherein a second set of at least two of the plurality of folding arm assemblies are rotatably connected to a corresponding second bracket of the plurality of second brackets fixedly coupled at a same location to the spine between the shipping configuration and the deployed configuration;

wherein, in the shipping configuration for each respective folding arm assembly of the first set, the at least two arms of the respective folding arm assembly are parallel to one another and non-collinear; and wherein, in the deployed configuration for each respective folding arm assembly of the first set, the at least two arms of the respective folding arm assembly are collinear.

17. The assembly of claim 1, wherein the solar tracking assembly is configured to rotate the plurality of solar panel sub-assemblies between a 0 degree position and a 90 degree position relative to the ground.

18. The assembly of claim 1, wherein the spine and the plurality of solar panel sub-assemblies are situated at a non-zero tilt relative to the ground.

19. The solar tracking assembly of claim 10, wherein the solar tracking assembly is configured to rotate the plurality of solar array panels between a 0 degree position and a 90 degree position relative to the ground.

20. The solar tracking assembly of claim 10, wherein the spine and the plurality of solar array panels are situated at a non-zero tilt relative to the ground.

21. The solar tracking assembly of claim 10, wherein the at least one winglet is secured to the at least one solar array panel at an edge of the solar array panel opposite the spine.

* * * * *